United States Patent [19]
Umeda et al.

[11] Patent Number: 5,608,616
[45] Date of Patent: Mar. 4, 1997

[54] POWER CONVERTER

[75] Inventors: Atsushi Umeda, Anjo; Norihito Tokura, Okazaki; Hirohide Sato, Toyokawa, all of Japan

[73] Assignee: Nippondenso Co., Ltd., Kariya, Japan

[21] Appl. No.: 351,027

[22] Filed: Dec. 7, 1994

[30]    Foreign Application Priority Data

Dec. 7, 1993  [JP]  Japan .................................. 5-306782
Dec. 13, 1993 [JP]  Japan .................................. 5-312161

[51] Int. Cl.⁶ .................................................... H01L 29/10
[52] U.S. Cl. ............................................................ 363/132
[58] Field of Search .................................... 363/132, 125, 363/131, 127, 19–21, 56, 97; 323/289, 271, 272, 282, 290, 320, 902; 361/93, 98; 307/31–34

[56]             References Cited

U.S. PATENT DOCUMENTS 4,985,743  1/1991  Tokura et al. ............................ 357/39
5,233,215  8/1993  Baliga ..................................... 257/490

FOREIGN PATENT DOCUMENTS 3824836  2/1989  Germany .
61-80858  4/1986  Japan .

Primary Examiner—Aditya Krishnan
Attorney, Agent, or Firm—Cushman, Darby & Cushman IP Group of Pillsbury Madison & Sutro LLP

[57]             ABSTRACT

A power converter for an AC generator for motor vehicles for converting a generated voltage of the AC generator driven by an engine into a DC voltage to feed to a battery includes at least either high-side MOS power transistors for connecting an output end of an armature coil which generates the generated voltage of the AC generator with a high potential end of a battery or low-side MOS power transistors for connecting the output end of the armature coil with a low potential end of the battery. The MOS power transistors each has a source region, a well region and a drain region. A high resistance connected with either a parasitic diode on the side connected with the source generated between the source region and well region or a parasitic diode on the side connected with the drain generated between the drain region and well region in parallel is formed in the MOS power transistors. Thereby, it allows blocking a reverse current produced by the parasitic diode and giving a necessary potential to the well region. Further, SiC is used in the MOS power transistors rather than Si.

18 Claims, 20 Drawing Sheets

POWER CONVERTER

CROSS REFERENCE TO RELATED APPLICATION

This application is based upon and claims the benefit of priority from the Japanese Patent Applications 5-306782 filed on Dec. 7, 1993 and 5-312161 filed on Dec. 13, 1993, the contents of each being incorporated herein by reference.

BACKGROUND OF THE INVENTION

1. Field of the Invention

The present invention relates to a power converter for an AC Motor Vehicle generator utilizing MOS power transistors and which is applicable to an alternator capable of generating power by turning kinetic energy during braking of the vehicle into electrical power and to the main drive motor of an electric car, as well as to a so-called alternator driven by an engine.

2. Related Art

There is known an AC generator for motor vehicles which includes a three-phase full-wave rectifier as a power converter having high-side semiconductor power elements and low-side semiconductor power elements for individually connecting each end of a three-phase armature winding of the AC generator, respectively, with a high potential end and a low potential end of a battery, and a controller for synchronously connecting/disconnecting each semiconductor power element and in which the three-phase full-wave rectifier converts a generated voltage of the three-phase armature winding into a DC voltage to feed to the battery. Japanese Patent Laid-open No. 4-138030, for example, discloses using a MOS power transistor as the semiconductor power element.

That is, an N-channel MOS power transistor type three-phase full-wave rectifier disclosed in the above-mentioned publication has three high-side MOS power transistors that connect each end of a three-phase armature winding of an AC generator for motor vehicles with a high potential end of a battery and three low-side MOS power transistors that connect each end of the three-phase armature winding with a low potential end of the battery.

For the MOS power transistor of this type, it is common to adopt a vertical MOS power transistor structure in which an N-type silicon substrate is formed as one main electrode of the MOS power transistor and an $N^+$-type region is formed on the surface of a P-type well region formed on the surface of the chip as another main electrode to maintain its withstanding voltage and to reduce ON resistance.

Further, while a parallel field coil scheme in which a field coil, which is connected in parallel with a three-phase full-wave rectifier, is used as a DC magnetizing means of a magnet core of an AC generator for motor vehicles and a magneto scheme whose structure and control are relatively simple are generally used, the present applicant has proposed a magneto scheme combined with a serial field coil in which a three-phase full-wave rectifier and exciting coil are connected in series to enhance a magnetic field flux as another method.

Because the three-phase full-wave rectifier using the MOS power transistors has a structure in which a parasitic diode which functions as a PN junction diode of the conventional three-phase full-wave rectifier and the MOS power transistor are connected in parallel, there is a possibility that a power loss equivalent to a voltage drop of the junction diode in the forward direction may be reduced as compared to the conventional three-phase full-wave rectifier using silicon diodes.

However, it was found from the analysis made by the present inventors that the above-mentioned MOS power transistor type three-phase full-wave rectifier has the following problems.

Because an accumulated amount of magnetic energy in the three-phase armature winding and field coil is large in the AC generator for motor vehicles, a withstanding voltage of each semiconductor power element of the three-phase full-wave rectifier has to be set to be more than a battery voltage, i.e., more than 20 times the output rectified voltage of the three-phase full-wave rectifier, e.g., about 300 V, as a measure to deal with such possible accidents as where it is instantaneously released as a voltage when an output terminal of the generator comes off, for example.

In an enhancement type MOS power transistor, a parasitic diode Ds on the side connected to the source is produced between a well region and source region and a parasitic diode Dd on the side connected to the drain is produced between the well region and drain electrode in principle. In the N-channel MOS power transistor, while the P-type well region is normally connected with a source electrode or a drain electrode in order to give a potential to the P-type well region, the P-type well region and the drain electrode have to be connected in the three-phase full-wave rectifier for the AC generator for motor vehicles (i.e., the parasitic diode Dd on the side connected to the drain is short-circuited).

That is, if the P-type well region and source electrode are connected and the parasitic diode Ds on the side connected to the source is short-circuited in the three-phase full-wave rectifier for the AC generator for motor vehicles, a reverse current (a diode forward direction current) flows through the parasitic diode Dd on the side connected to the drain when a generated voltage connected to the drain electrode of the high-side MOS power transistor drops to less than the battery voltage. Similarly, a reverse current (a diode forward direction current) flows through the parasitic diode Dd on the side connected to the drain if a generated voltage connected to the source electrode of the low-side MOS power transistor rises above a potential (ground potential) voltage at the low potential end of the battery. Accordingly, the P well region has to be connected to the drain electrode in order to block the reverse current flowing through the parasitic diode Dd by the parasitic diode Ds on the side connected to the source. The same applies to a P-channel MOS power transistor as well.

However, in the conventional MOS power transistor structure shown in FIG. 7 or 8, a P-type well region 103 and $N^+$-type region 104 on the surface Of the region 103 cannot but be short-circuited to extend a PN junction depletion layer 107 between the P-type well region 103 and an N-type epitaxial voltage withstanding layer 105 toward the N-type voltage withstanding layer 105 to earn a withstanding voltage during OFF.

That is, when the three-phase full-wave rectifier for the AC generator for motor vehicles is constructed from the above-mentioned MOS power transistor structure, an $N^+$-type substrate 106 must be set as a source region and the $N^+$-type region 104 must be set as a drain region. By doing so, however, a large source parasitic resistance Rs of the N-type voltage withstanding layer 105 is connected between a substantial source end S' and the source electrode in series.

A drain saturation current Idsat of the MOS transistor may be expressed as follows;

$$Idsat = K(Vg - Vs')^2$$
$$= K(\Delta Vgs - Idsat \cdot Rs)^2$$

wherein a threshold voltage Vt is ignored for simplification and where K is a proportional constant, ΔVgs is a voltage between source and gate (Vg–Vs), Vg is a gate voltage, Vs' =Vs+Idsat·Rs is a potential at the substantial source end S'.

That is, for the drain saturation current (maximum current when a predetermined gate voltage is applied) Idsat, it is equivalent to that the gate voltage Vg equivalent to Idsat·Rs has dropped. Changes of the threshold voltage Vt due to a substrate effect is also ignored.

For example, when a gate voltage is +20 V, source (battery) potential is +12 V, current is 100 A and source parasitic resistance Rs is 0.05 Ω, an actual source potential Vs' turns out to be 17 V, which indicates that a channel current drops to %4 as compared to a case when Rs is 0. That is, it can be seen that the channel current is reduced extremely by the minor increase of the source parasitic resistance Rs. Hereinafter, this current reducing effect, i.e. a channel resistance increasing effect, will be referred to as a source resistance feedback effect.

While the above expression illustrates the drain current saturation region, a drain non-saturation current is also reduced by the increase of Rs in a non-saturation region. Such a reduction of the drain current implies that the increase of the channel resistance and the increase of the source parasitic resistance Rs causes a power loss due to the increase of the channel resistance. A power loss is caused by itself, so that it can be seen that a considerable amount of power is lost and heat is generated as a whole.

Although it is possible to thin the N-type voltage withstanding layer 105 in order to reduce the source parasitic resistance Rs, it is difficult to thin the N-type voltage withstanding layer 105 since the AC generator for motor vehicles requires a high withstanding voltage of 300 V.

That is, a yield field strength of a silicon is about 30 V/μm in a conventional silicon MOS power transistor and if the above-mentioned 300 V of withstanding voltage is to be earned only by the N-type voltage withstanding layer 105, its thickness has to be 10 μm assuming that the field strength within the N-type voltage withstanding layer 105 is constant. Actually, because the field strength is concentrated near the PN junction, the thickness has to be more than about 20 μm and its impurity concentration has to be less than about 1×10$^{15}$ atoms/cm$^3$ if the field strength near the PN junction is about 30 V/μm and the N-type voltage withstanding layer 105 is to bear the 300 V of withstanding voltage. The formation of the N-type voltage withstanding layer 105 having such thickness and impurity concentration to maintain the withstanding voltage causes increases in the source parasitic resistance Rs and the loss of the resistance due to that and the reduction of the drain current (the considerable increase of the channel resistance) as described above. As a result, the MOS power transistor type three-phase full-wave rectifier in the above-mentioned publication has problems that it is theoretically impossible for it to exceed the PN junction diode type three-phase full-wave rectifier for the use of the AC generator for motor vehicles (i.e. in the reactance load field) and that its structure and control are complex.

On the other hand, it is conceivable to constitute the N$^+$-type region 104 as the source electrode and the N$^+$-type substrate 106 as the drain electrode and to short-circuit the P-type well region 103 and the N$^+$-type substrate 106 in the MOS power transistor structure shown in FIG. 7 or 8 described above. However, it is extremely difficult to maintain 300 V of withstanding voltage between the N$^+$-type region 104 constituting the source electrode and the P-type well region 103 and to maintain the withstanding voltage between the gate electrode and the P-type well region 107 and the N$^+$-type region 104.

SUMMARY OF THE INVENTION

Accordingly, it is a primary object of the present invention to solve the aforementioned problems by providing a power converter for an AC generator for motor vehicles, which gives a potential to a well region and prevents a reverse current from flowing, causes a smaller power loss, and can be easily cooled.

It is another object of the present invention to provide a power converter for an AC generator for motor vehicles having a simple structure.

It is a further object of the present invention to prevent overcharging in the case of a generator in which no field control is carried out.

In order to achieve the aforementioned objects, a power converter of the present invention comprises high-side MOS power transistors or low-side MOS power transistors for connecting each end of an armature winding of an AC generator for motor vehicles with a high potential end or low potential end of a battery. Further, the MOS power transistor has a high resistance which is connected with either of parasitic diodes between a source region or drain region and a well region in parallel.

The high resistance prevents a reverse current from flowing through the parasitic diode from the battery to the armature winding. Furthermore, because the high resistance is connected with the parasitic diode in parallel, a potential is given to the well region through the high resistor.

By the way, if the high resistance is connected with the parasitic diode (parasitic diode Dd on the side connected to the drain) between the drain region and the well region in parallel, the potential is given to the well region through the high resistor. By doing so, a battery charge current flowing through the parasitic diode (parasitic diode Ds on the side connected to the source) between the source region and the well region is considerably reduced by the high resistor and overcharging of the battery may be favorably suppressed even when a magnetic field is implemented.

Further, if the high resistance is connected with the parasitic diode Ds on the side connected to the source in parallel, the potential is given to the well region through the high resistor. By doing so, the battery charge current flowing through the parasitic diode is blocked by a large resistance of the inverse bias junction of the parasitic diode Dd on the side connected to the drain. While the above-mentioned parasitic diode Dd becomes forward biased when a potential of the three-phase armature winding is low and a drain potential of the MOS power transistor is low, the current reversely flowing from the battery through the parasitic diode Dd is favorably suppressed by the high resistance.

Accordingly, the well region and the drain region need not be short-circuited in order to give the potential to the well region in the MOS power transistor in which the high resistance is built. As a result, a voltage withstanding layer may be provided between the well region and the drain region. It means that a large power loss and heat caused by the source parasitic resistance Rs described above may be remarkably reduced since a voltage withstanding layer needs not be provided between the source electrode and a channel starting end. Specifically, a source potential is fixed almost to a potential at the high potential end of the battery in the high-side MOS power transistor in which it is difficult to reduce the resistance in the N-channel MOS power transistor, so that the power loss and heat may be considerably reduced due to the decrease of the source resistance feedback effect described before and cooling and arrangement can be made simply.

It is also possible to arrange so that either the high-side or low-side MOS power transistor has the high resistance on the side connected to the drain connected with the parasitic diode Dd on the side connected to the drain in parallel and the other of the high-side and low-side MOS power transistors has the high resistance on the side connected to the source connected with the parasitic diode Ds on the side connected to the source in parallel.

By doing so, a bypass route composed of the high resistance and parasitic diode Ds of the both high-side and low-side MOS power transistors will have the parasitic diode Dd on the side connected to the drain and the parasitic diode Ds on the side connected to the source which are not bypassed by the high resistance and whose directions are opposite from each other, so that a DC current flowing through the bypass route is blocked.

Further, the resistance of the voltage withstanding layer may be remarkably reduced if the MOS power transistor is formed using monocrystal SiC as its base material, as compared to a transistor using Si as its base material. The decrease of the resistance of the voltage withstanding layer is important when the voltage withstanding layer constitutes the source parasitic resistance since a small increase of the source parasitic resistance might increase the channel resistance considerably.

Further, it is possible to construct the MOS power transistors either by high-side or low-side elements and to replace the other of either the high-side or low-side elements with PN junction diodes. By doing so, the structure and control may be simplified.

The MOS power transistor may be of a vertical MOS power transistor. That is, the MOS power transistor comprises an $N^+$-type substrate constituting a drain electrode, an N-type voltage withstanding layer formed on the substrate, a P-type well region formed on the surface of the voltage withstanding layer, an $N^+$-type source region formed on the surface of the P-type well region and constituting a source electrode, and a gate electrode disposed on the surface of the P-type well region through an insulating film and for conducting the source region and voltage withstanding layer.

By doing so, the substrate can constitute the source electrode, so that the voltage withstanding layer comes to the drain side and the channel resistance may be considerably reduced by the decrease of the source parasitic resistance Rs as compare to the prior art MOS power transistor in which the voltage withstanding layer comes to the source side.

Further, the MOS power transistor is formed using the monocrystal SiC as its base material and a withstanding voltage between the source and drain and the drain and gate of the MOS power transistor is set at more than 100 V.

That is, although the source parasitic resistance Rs increases when the voltage withstanding region is disposed on the source side, the source parasitic resistance may be remarkably reduced by using the high withstanding voltage SiC. The channel resistance may also be remarkably reduced and accordingly, the power loss may be remarkably reduced.

Further, the high resistance may be composed of alloy layers of a metallic electrode disposed on the surface of the well region and the monocrystal SiC base material constituting the well region.

Thereby, the high resistance may be simply formed and the loss of resistance due to the voltage withstanding layer may be reduced.

By the way, as the high resistance, it is also possible to implant conductive ions at the junction interface of the source and well regions or to connect the well region and source electrode with a polysilicon layer having a certain resistivity.

It is also possible that the power converter has the low-side MOS power transistors for connecting each end of the three-phase armature coil and the low potential end of the battery in parallel, the substrate constitutes a drain electrode common to each of the low-side MOS power transistors, P-type well regions in respective phases are individually formed on the substrate, $N^+$-type source regions are individually formed on the surface of respective P-type well regions, and each gate electrode for forming a channel for individually conducting each source region and voltage withstanding layer is individually disposed on the surface of each P-type well region through an insulating film.

By doing so, because it has the common drain structure, three low-side MOS power transistors may be integrated on one chip without increasing the source parasitic resistance Rs and the structure may be simplified.

Furthermore, it is possible to construct the three-phase full-wave rectifier by the high-side MOS power transistors and low-side MOS power transistors and to store the three-phase full-wave rectifier and a regulator of rectified voltage within a same metallic case to attach to a housing of the generator.

By doing so, an area occupancy rate of the end face of the housing may be considerably reduced, allowing reductions in space and reductions in a ventilation resistance.

The above and other advantages of the present invention will become more apparent in the following description and the accompanying drawings in which like numerals refer to like parts.

DETAILED DESCRIPTION OF PREFERRED EMBODIMENT

[First Embodiment]

A structure of an AC generator for motor vehicles, i.e. a so-called alternator, according to the present embodiment which is driven by a car engine will be explained with reference to FIGS. 1 through 4.

Figure 1:
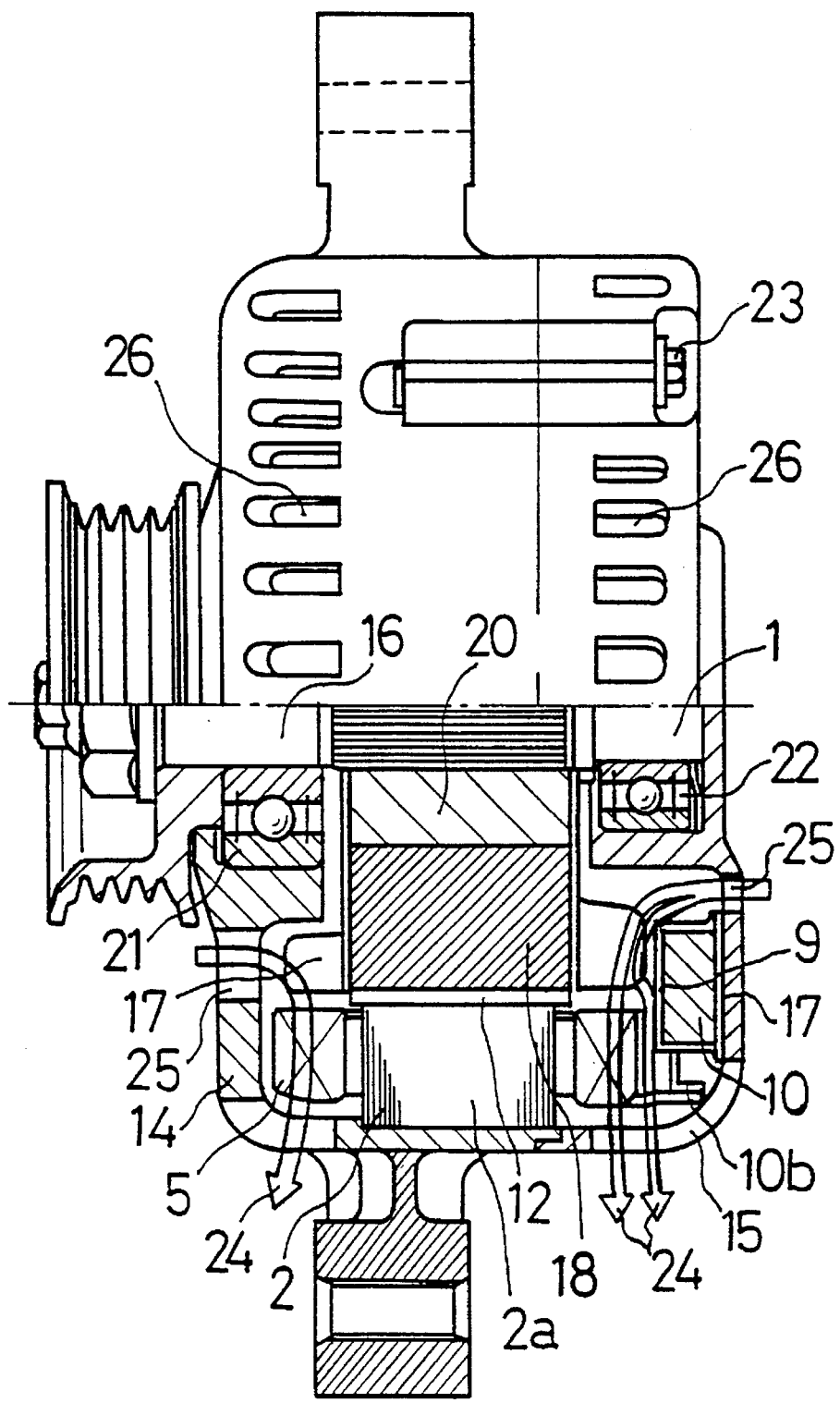
FIG. 1 is a section view of an AC generator for motor vehicles according to a first embodiment of the present invention.
Figure 2:
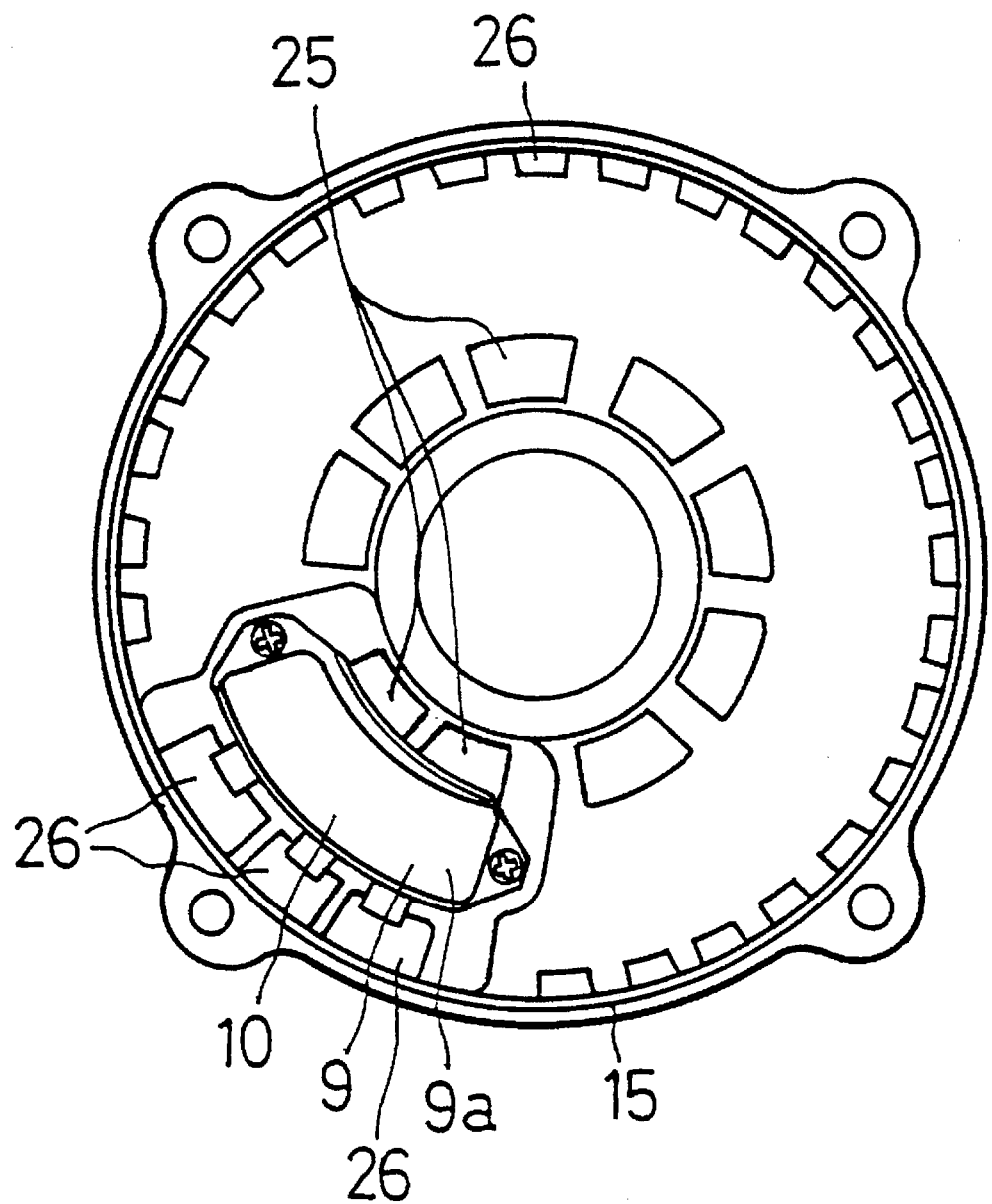
FIG. 2 is a side view of the AC generator for motor vehicles seen from the rear side by removing a cover thereof.
Figure 3:
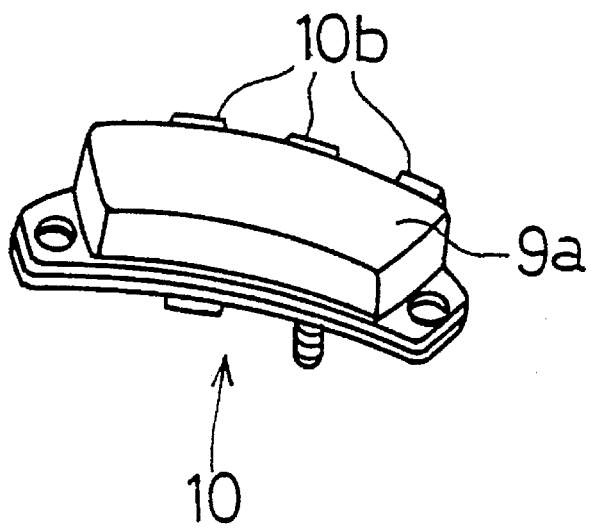
FIG. 3 is a perspective view of a rectifier controller 10 in FIG. 1.

FIG. 1 is a sectional view showing a structure of the AC generator for motor vehicles according to a first embodiment of the present invention. The generator is composed of a magneto rotor 1 having no excitation adjusting means and a three-phase armature winding 5 induced by the rotor 1.

A sheath of the generator is composed of front housing 14 and rear housing 15 which are coupled by four through-bolts 23. A stator core 2 is fixed within an inner periphery of the housings 14 and 15 and the three-phase armature winding 5 is wound around the stator core 2. Bearings 21 and 22 fixed by the housings 14 and 15 rotably support the rotor 1. The rotor 1 comprises a magnet 18, rotor core 12 and non-magnetic member 20 and shaft 16 which supports them.

Figure 4:
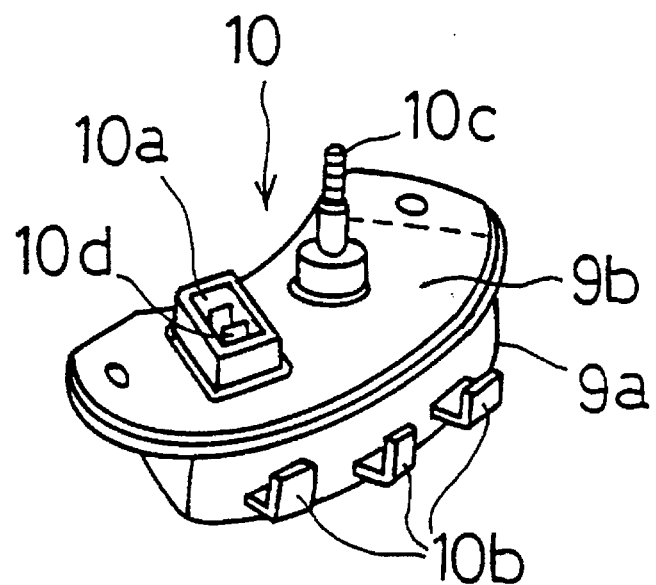
FIG. 4 is a perspective view of the rectifier controller 10 in FIG. 1.

Attached by screws inside the rear housing 15 is a rectifier controller 10. The rectifier controller 10 has input terminals 10b for three-phase AC output current, B current output terminal 10c (FIG. 4) and input and battery signal input terminal 10d (FIG. 4). The three-phase armature winding 5 and the input terminal 10b for three-phase AC current are connected by soft soldering or the like at locations of cooling air discharge windows 26 described later, the B current output terminal 10c and a harness (not shown) are connected by a nut and the battery signal input terminal 10d and an engine key switch signal terminal 10a are connected by a connector. The rectifier controller 10 thus formed in one body is surrounded by a metallic electromagnetic shield member 9, except for the input/output terminals, to effect an electromagnetic shield and to release heat.

Fans 17 are provided for the rotor 1 at both end surfaces and cooling air 24 is drawn in from inlet windows 25 provided on the front and rear housings 14 and 15. The rectifier controller 10, inlet windows 25 and discharge windows 26 are disposed so that they are arranged approximately in a centrifugal direction. Thereby a part of the cooling air hits against the surface of a ceiling side member 9a of the electromagnetic shield member 9 which faces to the fan 17 and acts as a shroud of the fan 17 and is discharged from the discharge windows 26. Similarly, a bottom side member 9b of the electromagnetic shield member 9 is closely attached to the rear housing 15 so that heat is transmitted favorably.

The rectifier controller 10 constructed as described above allows reduction of an occupancy rate of an end surface area of the rear housing 15 in the axial direction, to save space, to reduce a ventilation resistance and to enhance a cooling effect as compared to a three-phase full-wave rectifier of an AC generator for motor vehicles having a conventional voltage regulator and a three-phase full-wave rectifier.

Next, opening/closing control of each of MOS power transistors 19a through 19f of a three-phase full-wave rectifier 19 by means of a voltage regulating section 30 will be explained.

The voltage regulating section 30 reads generated voltages in each phase Vu, Vv and Vw, which are potentials at output terminals of the three-phase armature winding 5 in each phase, selects a line generated voltage among their line generated voltages Vu–Vv, Vv–Vw and Vw–Vu which is greater than a terminal voltage of a battery 31 and turns on one of MOS power transistor among high-side MOS power transistors 19a through 19c and one MOS power transistor among low-side MOS power transistors 19d through 19f so that the selected line generated voltage is applied to the battery 31. Thereby, a charge current is fed from the selected three-phase armature winding to the battery 31.

Similar to a conventional regulator, the voltage regulating section 30 detects a terminal voltage of the battery 31, compares a detected voltage with a preset reference voltage and based on the comparison result, controls a connection/disconnection of a generated current to maintain the terminal voltage of the battery 31 at a target level.

Figure 5:
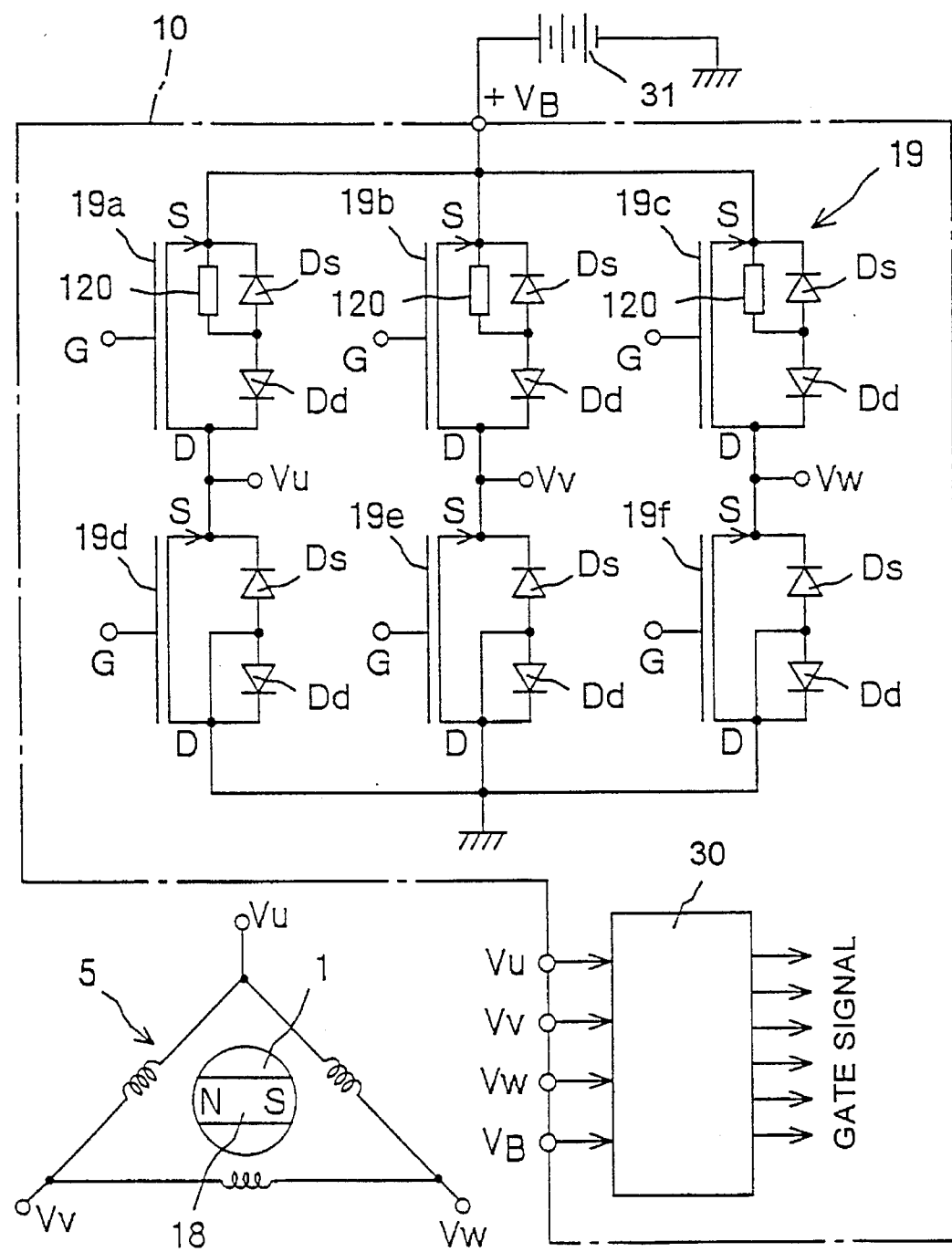
FIG. 5 is a circuit diagram of the AC generator for motor vehicles in FIG. 1.

Next, a structure of a circuit of the AC generator for motor vehicles of the present embodiment will be explained with reference to FIG. 5.

The rectifier controller 10 comprises a three-phase full-wave rectifier 19 and the voltage regulating section 30. The three-phase full-wave rectifier 19 comprises N-channel enhancement type MOS power transistors 19a through 19f using monocrystal SiC as their base material wherein the high-side MOS power transistors 19a through 19c connect the output terminal in each phase of the three-phase armature winding 5 with a high potential end of the battery 31 and the low-side MOS power transistors 19d through 19f connect the output terminal in each phase of the three-phase armature winding 5 with a low potential end of the battery 31.

The voltage regulating section 30 receives the generated voltage in each phase Vu, Vv and Vw from the output terminal in each phase of the three-phase armature winding 5 and based on those input signals, controls a gate voltage to be applied to each gate electrode of the MOS power transistors 19a through 19f. That is, the voltage regulating section 30 of the rectifier controller 10 reads a voltage of the battery 31 and controls opening/closing of the MOS power transistors 19a through 19f so that it becomes constant.

Figure 7:
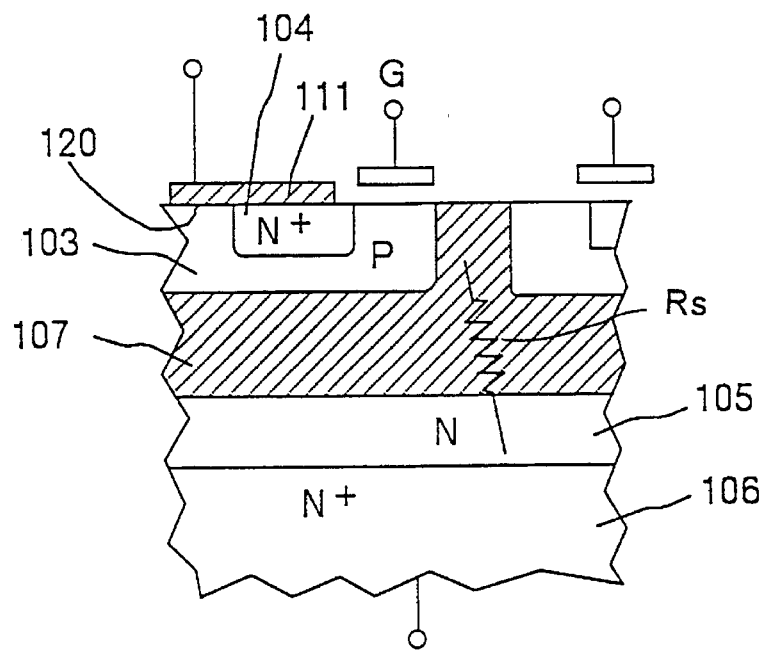
FIG. 7 is a partially enlarged sectional view illustrating one example of a MOS power transistor composing the three-phase full-wave rectifier in FIG. 1.
Figure 8:
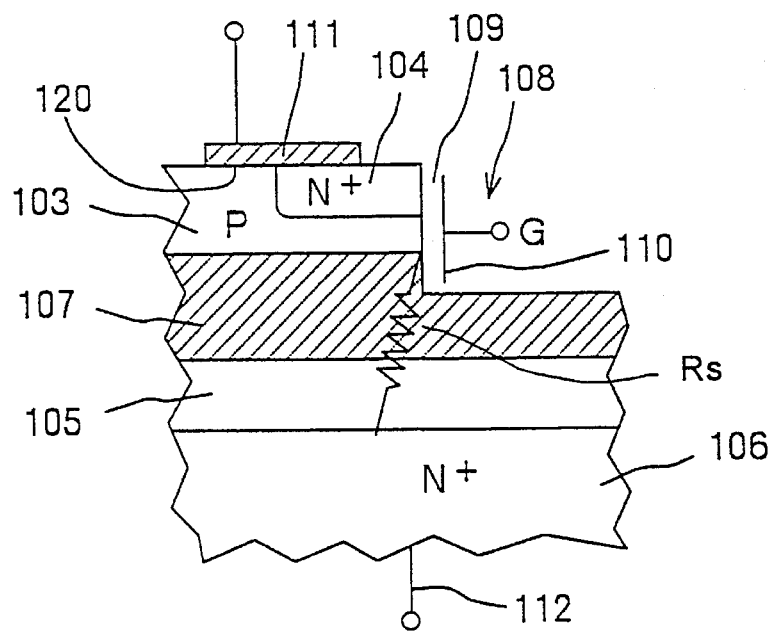
FIG. 8 is a partially enlarged sectional view illustrating another example of the MOS power transistor composing the three-phase full-wave rectifier in FIG. 1.

A detail of the MOS power transistor type three-phase full-wave rectifier 19 using SiC described above will be explained further with reference to FIGS. 6(a), 6(b), 7 and 8. By the way, FIGS. 6(a) and 6(b) are inverter circuit diagrams showing one phase portion of the MOS power transistor type three-phase full-wave rectifier of the present invention and FIGS. 7 and 8 show a part of sectional structure of the MOS power transistors 19a through 19f, which are formed of SiC in the present invention.

Figures 6A, 6B:
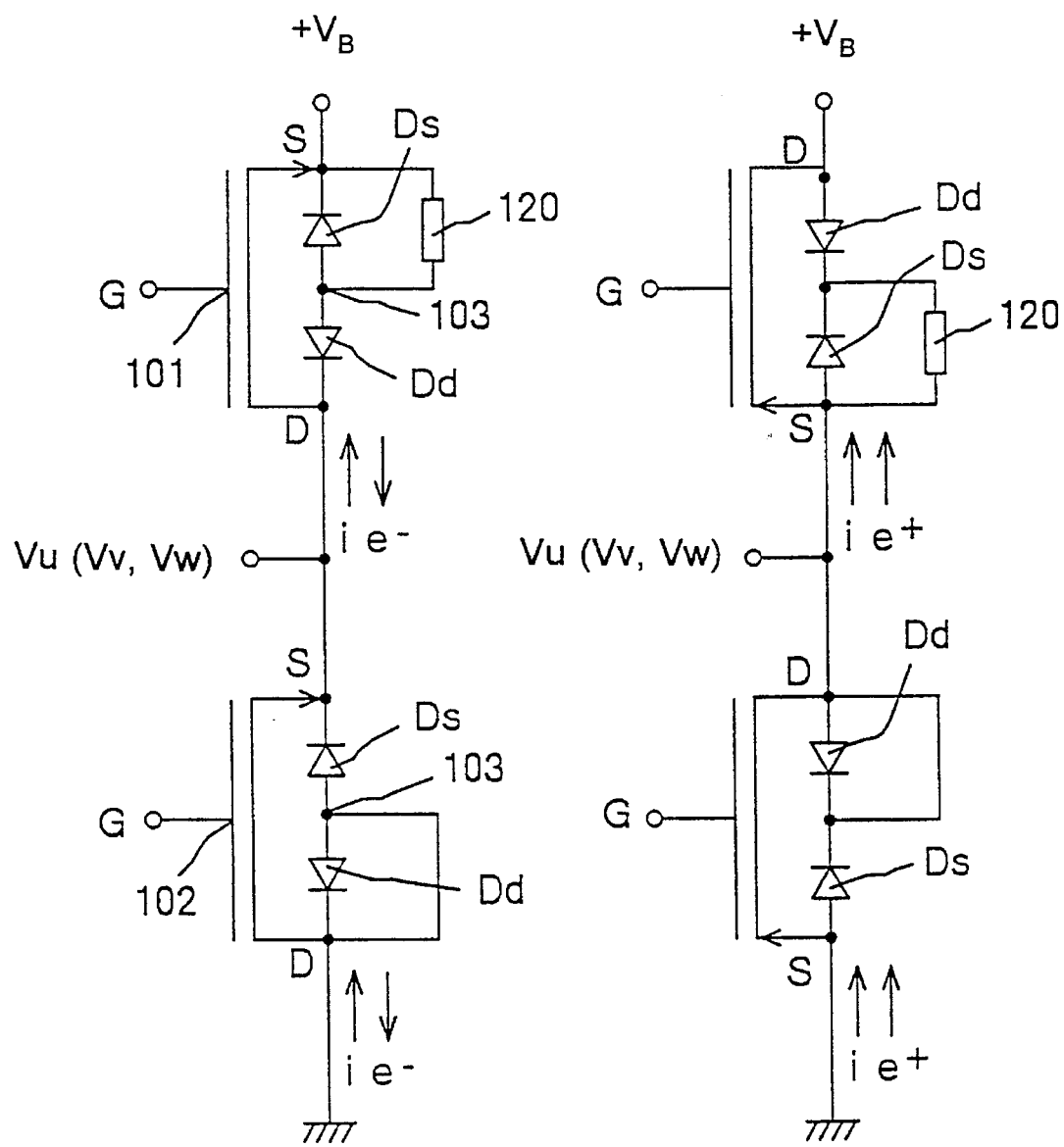
FIGS. 6(*a*) and 6(*b*) are equivalent circuit diagrams of an inverter circuit showing one phase of a three-phase full-wave rectifier in FIG. 1.

In the inverter circuits of the N-channel MOS power transistor shown in FIG. 6(a), a drain electrode D of a high-side MOS power transistor 101 and a source electrode S of a low-side MOS power transistor 102 are connected to one phase output end of the three-phase armature winding 5, a drain electrode D of the low-side MOS power transistor 102 is connected to the low potential end of the battery 21 and a source electrode S of the high-side MOS power transistor 101 is connected to the high potential end of the battery 21. A direction of charge current during battery charge and the direction of electron movement is opposite and the source electrode refers to an electrode on the side infusing carrier charge to the channel while charging the battery.

In the MOS power transistors 101 and 102, while a parasitic diode Ds on the side connected with the source and a parasitic diode Dd on the side connected with the drain are generated as shown in the figures between a P-type well region 103 which is described later, i.e., a region right under the gate electrode 101, and the source electrode S or the drain electrode D, the P-type well region 103 of the high-side MOS power transistor 101 is connected to the source electrode S through a high resistance 120 so as to give a potential to the P-type well region 103. On the other hand, the P-type well region 103 and the drain electrode D are short-circuited also in the low-side MOS power transistor 102 from so as to give a potential to the P-type well region 103. The reason for that has been described before. Thereby, the parasitic diode Ds on the side connected with the source in the low-side MOS power transistor 102 blocks the reverse current described earlier.

On the other hand, the high resistance 120 having such a high resistance as, for example, more than 150 Ω compresses the reverse current flowing through the parasitic diode Dd on the side connected with the drain into a permissible range when the generated voltage, i.e., a drain potential of the high-side MOS power transistor 101, drops less than the battery potential and when another MOS power transistor (not shown) is turned on.

Next, a portion of the sectional structure of the high-side MOS power transistor 101 in the three-phase full-wave rectifier 19 shown in FIG. 6(a) will be explained with reference to FIG. 8.

An N-type voltage withstanding layer 105 is formed on an $N^+$-type substrate 106 made of SiC by means of epitaxial growth. The P-type well region 103 is formed on the surface of the N-type voltage withstanding layer 105 by ion-implanting aluminum and an $N^+$-type region 104 is formed on the surface of the P-type well region 103 by ion-implanting nitrogen. A trench 108 is etched by means of known reactive ion etching while opening only a region where the trench is to be created and masking by a resist or an insulating film on the surface of the wafer. After that, a gate insulating film 109 made of a silicon oxide film is formed on the surface of the trench 108 by means of thermal oxidation and a gate electrode 110 made of doped polysilicon is formed at the trench 108. Then, a field insulating film (not shown) is opened by means of photolithography, a nickel electrode 111 is contacted with the $N^+$-type region (source electrode) 104 and the P-type well region 103 and a metal electrode 112 contacts with the $N^+$-type substrate (drain electrode) 106. The fabrication of the element is thus completed.

The nickel electrode 111 is formed by means of sputtering or vacuum deposition. A high resistant alloy layer (not shown) made from nickel and SiC is formed between the nickel electrode 111 and the P-type well region 103. This alloy layer constitutes the high resistance 120.

Because the $N^+$-type region 104 constitutes the source electrode S, the $N^+$-type substrate 106 constitutes the drain electrode D, and the N-type voltage withstanding layer 105 is disposed on the drain side in the high-side MOS power transistor 101 in FIG. 8 fabricated as described above, a source parasitic resistance Rs may be remarkably reduced while maintaining a high withstanding voltage, allowing the high withstanding voltage and low resistance to be compatible as a result. Furthermore, the adoption of the SiC allows a considerably drop in the resistance of the N-type voltage withstanding layer 105 and to remarkably improve its power loss.

FIG. 7 is another example the structure shown in FIG. 8.

Next, a portion of sectional structure of the low-side MOS power transistor 102 in the three-phase full-wave rectifier 19 in FIG. 6(a) will be explained with reference to FIG. 8.

The N-type voltage withstanding layer 105 is formed on the $N^+$-type substrate 106 made of SiC by means of epitaxial growth. The P-type well region 103 is formed on the surface of the N-type voltage withstanding layer 105 by ion-implanting aluminum and the $N^+$-type region 104 is formed on the surface of the P-type well region 103 by ion-implanting nitrogen. The trench 108 is etched by means of known reactive ion etching while opening only the region where the trench is to be created and masking by a resist or an insulating film on the surface of the wafer. After that, the gate insulating film 109 made of a silicon oxide film is formed on the surface of the trench 108 by means of thermal oxidation and the gate electrode 110 made of doped polysilicon is formed at the trench 108. Then, the ohmic metal electrode 111 is contacted with the $N^+$-type region (drain electrode) 104 and the metal electrode 112 is contacted with the $N^+$-type substrate (source electrode) 106. The fabrication of the element is thus completed.

Accordingly, in the present embodiment, when a high voltage (e.g., +300 V) is applied between the source region 106 and the drain electrode 111 while the MOS power transistor is turned off, a depletion layer 107 is extended mainly to the N-type voltage withstanding layer 105 to withstand this high voltage. As a result, the N-type voltage withstanding layer 105 turns out to be the source feedback resistance Rs and causes a power loss due to its own resistance and to the channel resistance increasing effect as described before.

However, because the monocrystal SiC is used as the base material in the present embodiment, the thickness and concentration of impurity of the N-type voltage withstanding layer 105 may be considerably improved as compared to that of Si of the past.

Now consider conditions for designing the N-type voltage withstanding layer 105 when a withstanding voltage of the N-type voltage withstanding layer 105 is 300 V.

In the case of Si, its yield field strength is about 30 V/μm. Then, the thickness of the N-type voltage withstanding layer 105 becomes about 20 μm, its impurity concentration becomes about $1 \times 10^{15}$ atoms/cm$^3$ and a resistivity of the Si-N-type voltage withstanding layer 105 becomes 5 Ω·cm.

In the case of SiC on the other hand, its yield field strength is about 400 V/μm. Then, the thickness of the N-type voltage withstanding layer 105 becomes about 4 μm, its impurity concentration becomes about $2 \times 10^{16}$ atoms/cm$^3$ and as a result, a resistivity of the SiC-N-type voltage withstanding layer 105 becomes about 1.25 Ω·cm.

Accordingly, because the resistance of the N-type voltage withstanding layer 105 is 'resistivity×thickness', the resistance of the N-type voltage withstanding layer 105 made of SiC may be reduced to about ⅟₂₀ as compared to that of an N-type voltage withstanding layer 105 made of Si.

In the end, the above-mentioned source parasitic resistance Rs in the low-side MOS power transistor made of SiC may be reduced to about ⅟₂₀ as compared to that made of Si, and corresponding to that, the channel resistance may be remarkably reduced as described above. Their synergetic effect allows realization of the three-phase full-wave rectifier 19 for the AC generator for motor vehicles that causes extremely low loss.

That is, it was found that the three-phase full-wave rectifier 19 having an excellent efficiency which is unpredictable from conventional ones may be realized by improving the yield field strength of the N-type voltage withstanding layer 105 by adopting SiC. Naturally, the above-mentioned relationship applies to a case when a high voltage other than 300 V is applied to the N-type voltage withstanding layer 105.

A further effect of the three-phase full-wave rectifier 19 of the present embodiment constructed as described above will be explained below.

Because the generated voltage increases in a high rotation speed range in the magneto generator, there has been a problem with conventional MOS power transistor type three-phase full-wave rectifiers that the battery is overcharged even when the MOS power transistor is turned off. This is because the parasitic diode Dd has to be short-circuited to give a potential to the well region to prevent a reverse current from flowing from the battery to the three-phase armature winding. In order to solve this problem, according to the present embodiment, the source electrode S of the high-side MOS power transistors 19a through 19c of the three-phase full-wave rectifier 19 are connected with the P-type well region 103 through the high resistor 120 to give a potential to the P-type well region 103 through the high resistance 120.

By doing so, because the parasitic diode Dd of the high-side MOS power transistors 19a through 19c blocks battery charge current which bypasses the channel, the over-charging of the battery 21 may be prevented. Further, the high resistance 120 limits the reverse current from the battery 21 to the three-phase armature winding 5 within a permissible range.

Contrary to that, it is also possible to short-circuit the parasitic diode Dd of the high-side MOS power transistors 19a through 19c and to connect the parasitic diode Ds of the low-side MOS power transistors 19d through 19f with the high resistance 120 in parallel. A problem that a DC current leaks from the battery 21 occurs if the high resistance 120 is connected to both high and low-side MOS power transistors 19a through 19f.

Beside that, it is also possible to replace the MOS power transistors (19d through 19f in FIG. 5) which are MOS power transistors on the short-circuit side with PN junction diodes.

Figure 9:
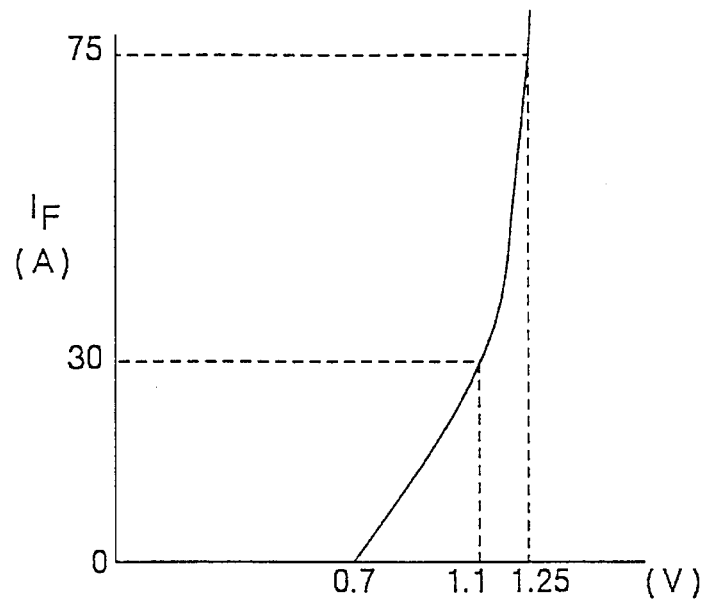
FIG. 9 is a voltage-current characteristic diagram of a PN diode using conventional Si as its base material.
Figure 10:
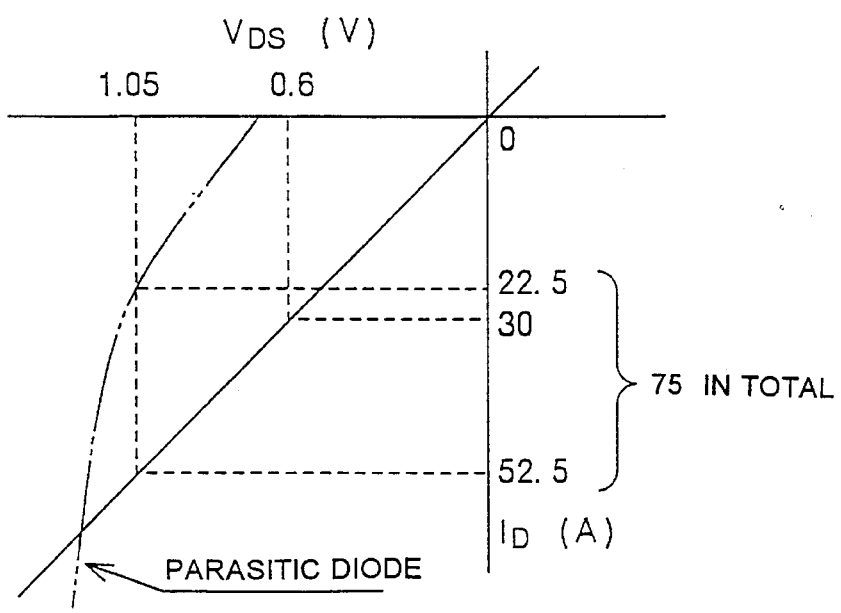
FIG. 10 is a voltage-current characteristic diagram of a MOS power transistor using conventional Si as its base material.
Figure 11:
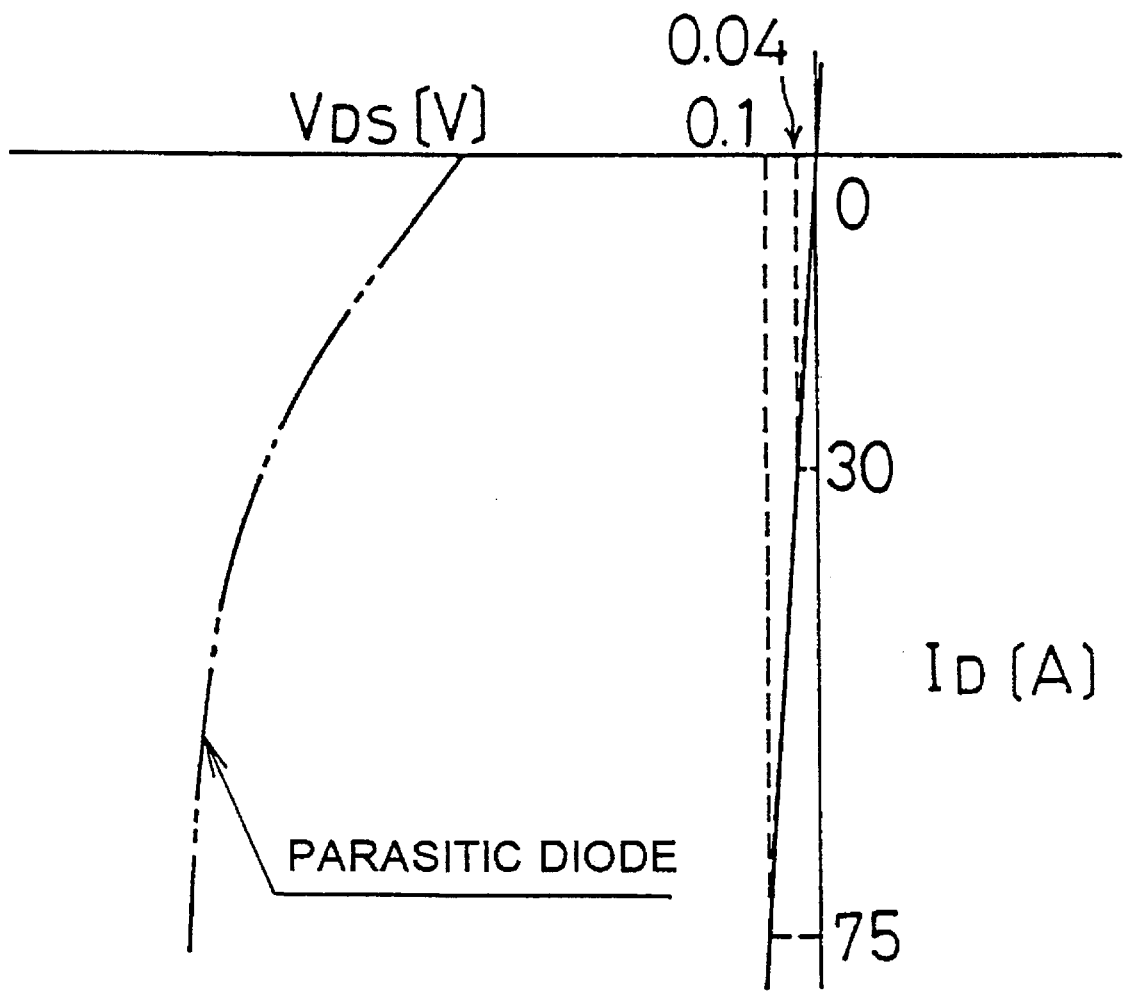
FIG. 11 is a voltage-current characteristic diagram of a MOS power transistor using SiC of the present embodiment as its base material.

FIGS. 9 through 11 show voltage and current characteristics of Si diode, Si MOS power transistor and SiC MOS power transistor fabricated in the same chip size and in the same design rule. Their withstanding voltage is set at 250 V. FIG. 9 shows the characteristics of the Si diode, FIG. 10 shows the characteristics of the Si MOS power transistor and FIG. 11 shows the characteristics of the SiC MOS power transistor. As it is apparent from FIGS. 9 through 11, it has become possible to reduce power loss by more than 90% with the three-phase full-wave rectifier 19 of the present embodiment as compared to the prior art three-phase full-wave rectifier under a condition of 75 A of output current.

Figure 12:
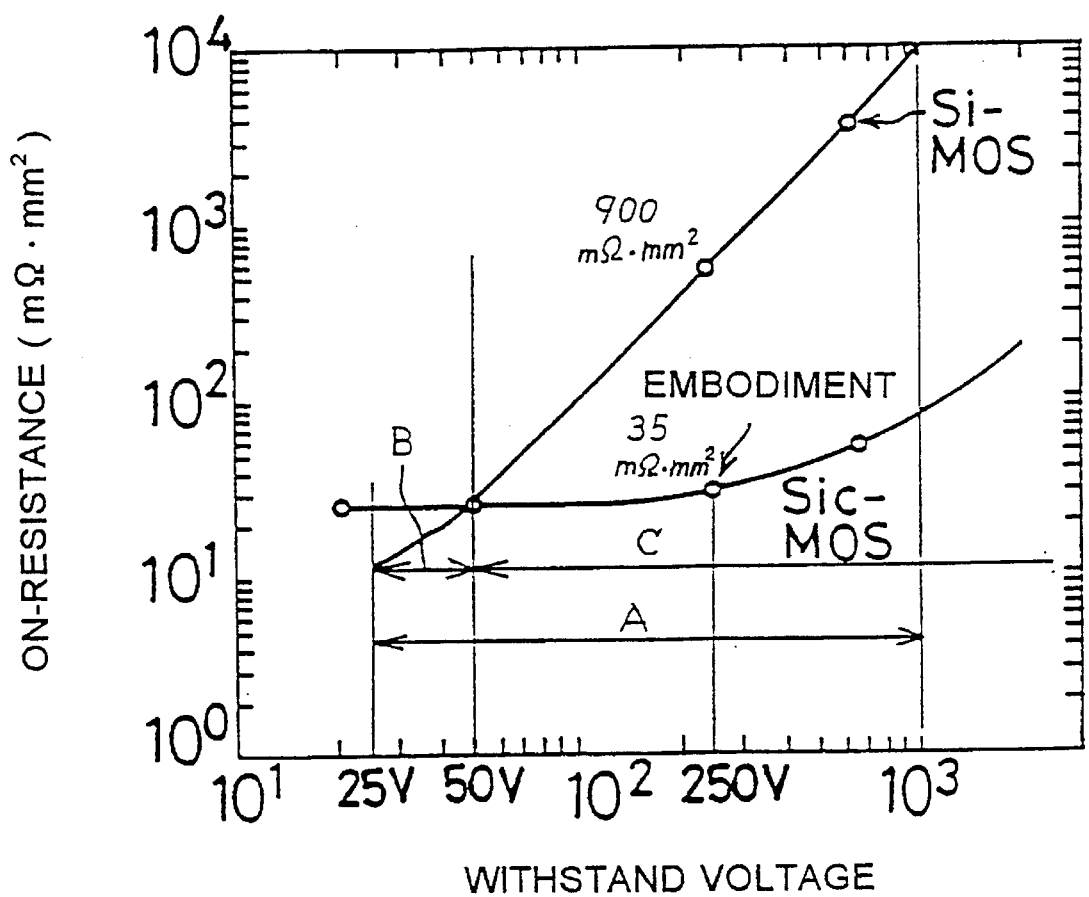
FIG. 12 is a graph showing a relationship between a withstanding voltage and channel resistance of the MOS power transistors in FIGS. 10 and 11.

FIG. 12 shows one example of a calculation result about ON resistivity when the required withstanding voltage of the MOS power transistor is changed. While the ON resistivity is a sum of a channel resistance and a resistance of the N-type voltage withstanding layer 105 and specifically the channel resistance fluctuates depending on various factors, the above-mentioned resistance of the N-type voltage withstanding layer 105 becomes dominant in the high withstanding voltage region as seen from FIG. 12.

That is, although the channel resistance itself barely changes even when the withstanding voltage is increased (when an increase of the channel resistance caused by the aforementioned feedback effect due to the increase of the source parasitic resistance Rs is ignored), the resistance of the N-type voltage withstanding layer 105 increases while keeping a positive correlation with the withstanding voltage. Accordingly, although the On resistivity proportionally increases along the increase of the withstanding voltage near 25 V in Si, the increase of the resistance of the N-type voltage withstanding layer 105 may be almost ignored up to 250 V of withstanding voltage in SiC and the ON resistivity gradually increases for the first time after exceeding 250 V of withstanding voltage.

[Second Embodiment]

Figure 13:
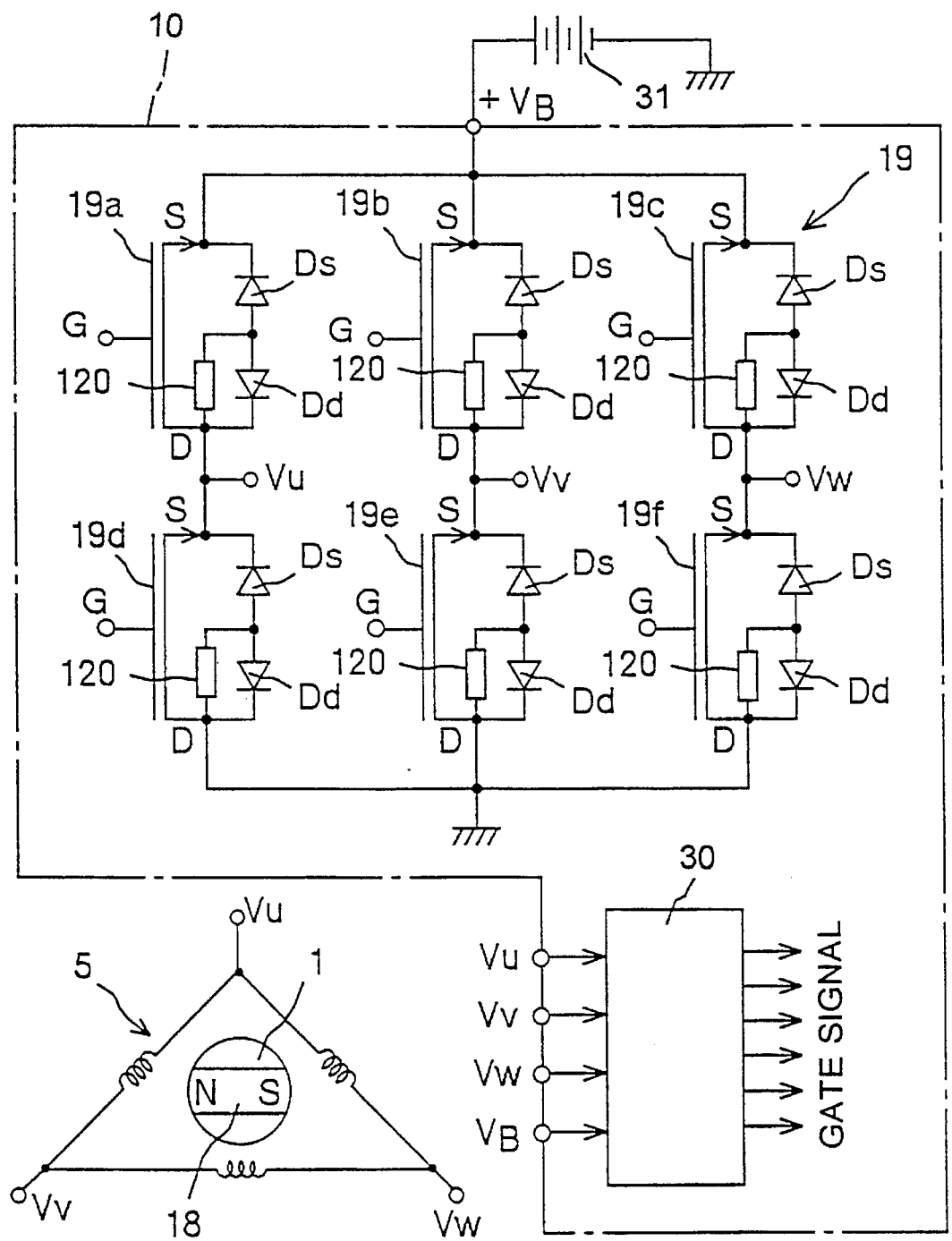
FIG. 13 is a circuit diagram showing a second embodiment.

A second embodiment of the present invention will be explained with reference to FIG. 13.

In this embodiment, the high resistance 120 is connected with the parasitic diode Dd on the side connected with the drain of the high and low-side MOS power transistors 19a through 19f in parallel.

Thereby, the high resistance 120 in the MOS power transistors 19a through 19f gives a potential to their P-type well regions 103 and reduces a bypassing generated current flowing through the parasitic diode Ds on the side connected with the source of the MOS power transistors 19a through 19f. Moreover, the reverse current from the battery 21 is blocked by the parasitic diode Ds.

[Third Embodiment]

Figure 14:
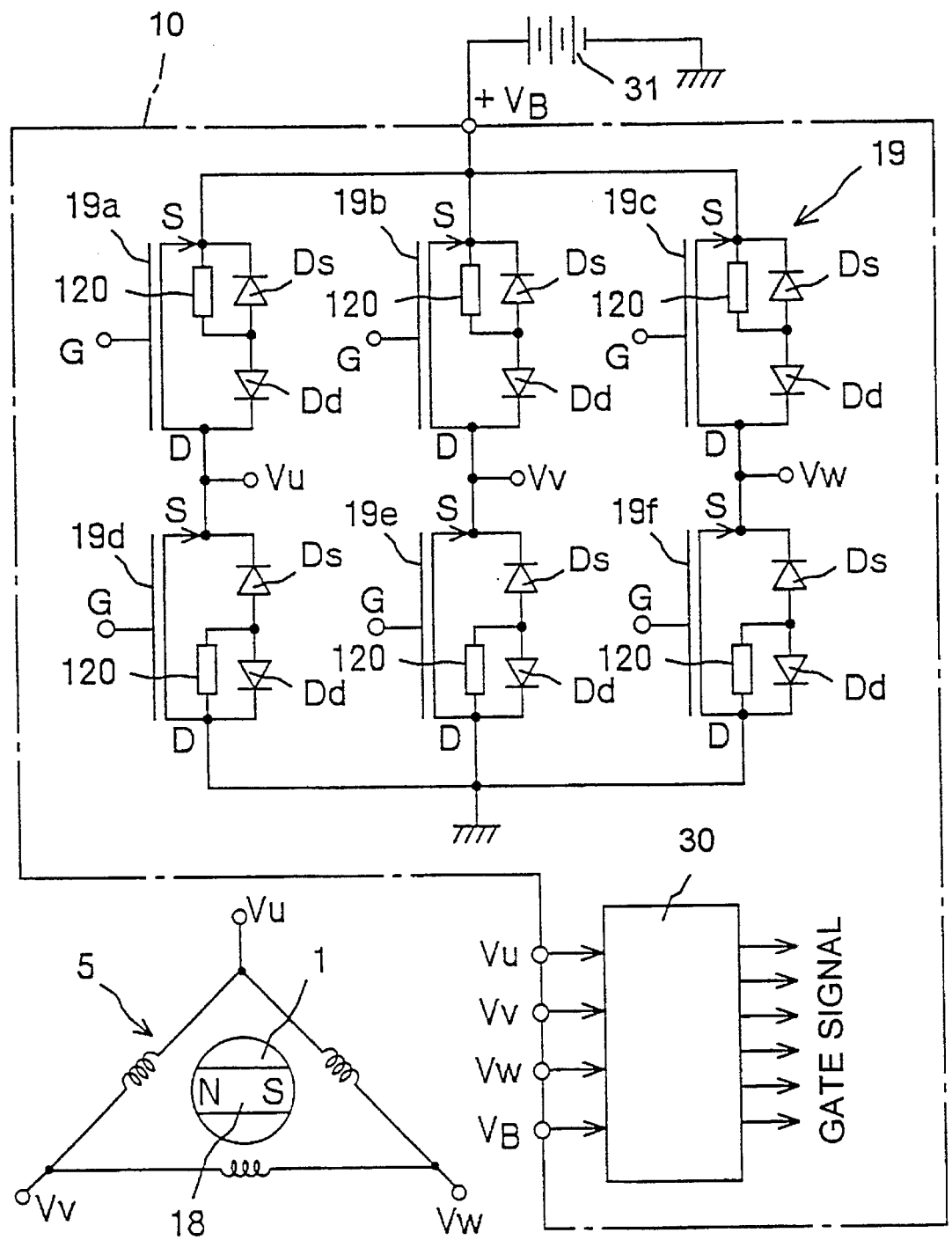
FIG. 14 is a circuit diagram showing a third embodiment.

A third embodiment of the present invention will be explained with reference to FIG. 14.

This embodiment has the high resistance 120 of the MOS power transistors 19a through 19f connected with the parasitic diode Ds on the side connected with the source in parallel in the first embodiment.

Thereby, the parasitic diode Dd on the side connected with the drain of the high-side MOS power transistors 19a through 19c blocks the battery charge current bypassing through the channel. Further, the parasitic diode Ds on the side connected with the source of the low-side MOS power transistors 19d through 19f blocks the reverse current from the battery 21.

Still more, the high resistance 120 in the low-side MOS power transistors 19d through 19f gives a potential to the P-type well region 103 and reduces the bypassing generated current flowing through the parasitic diode Ds on the side connected with the source of the low-side MOS power transistors 19d through 19f.

[Fourth Embodiment]

Figure 15:
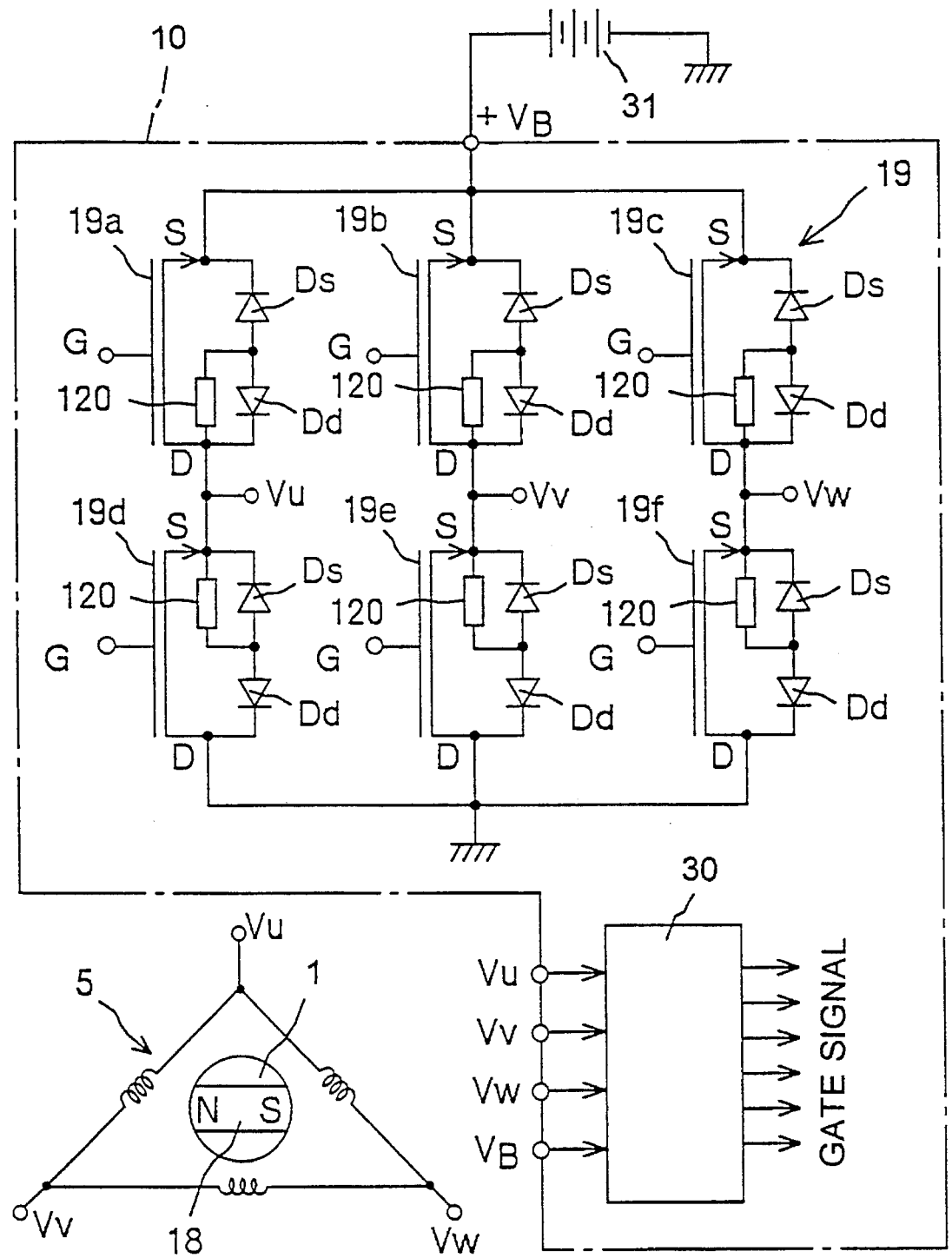
FIG. 15 is a circuit diagram showing a fourth embodiment.

A fourth embodiment of the present invention will be explained with reference to FIG. 15.

In this embodiment, the high resistance 120 is connected in a manner opposite from the third embodiment. That is, the high resistance 120 of the high-side MOS power transistors 19a through 19c is connected with the parasitic diode Dd in parallel and the high resistance 120 of the low-side MOS power transistors 19d through 19f are connected with the parasitic diode Ds in parallel. Its effect is the same as that of the third embodiment.

Figure 16:
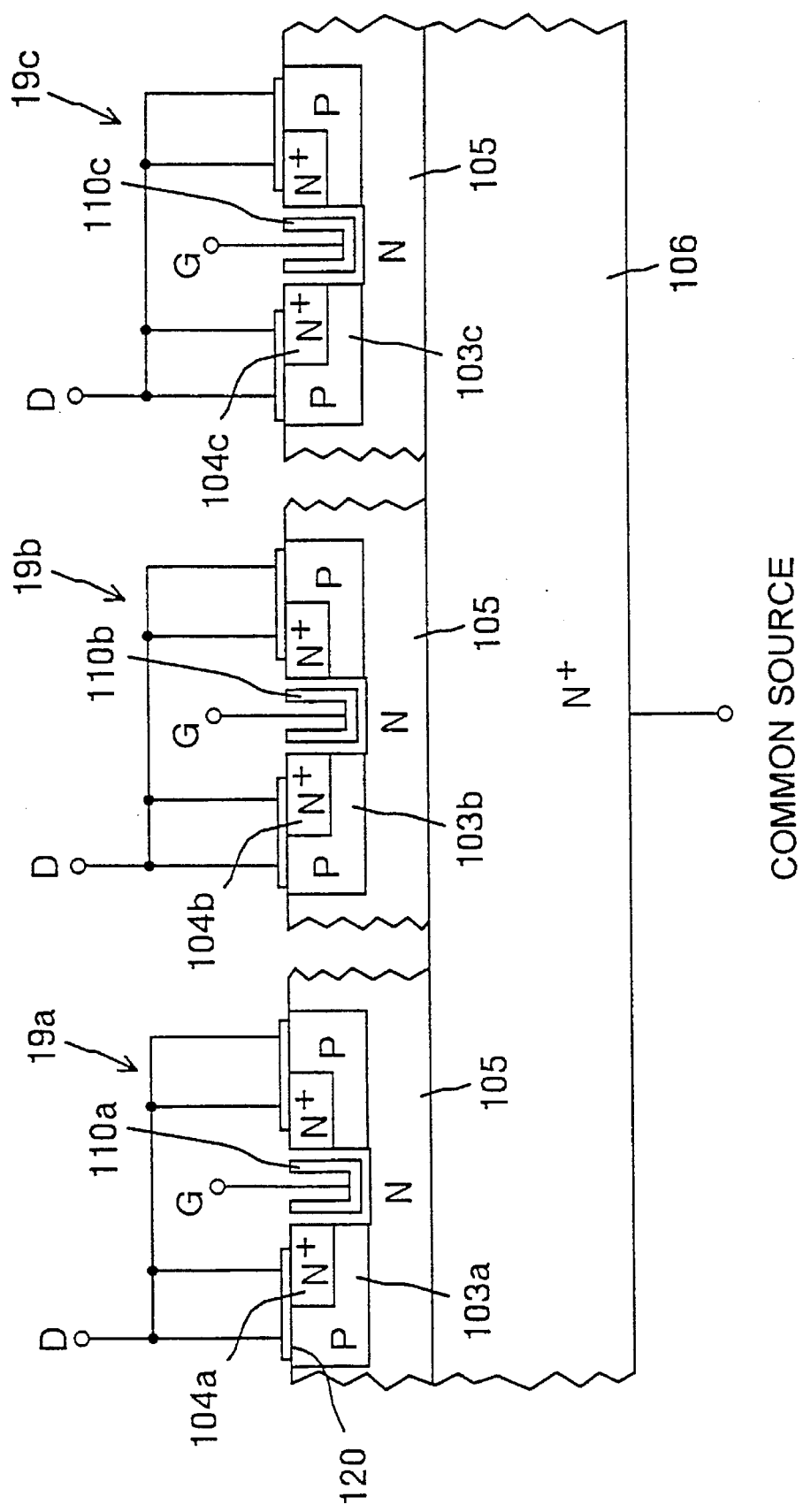
FIG. 16 is an exemplary section view of high-side MOS power transistors 19a through 19c in FIG. 15.
Figure 17:
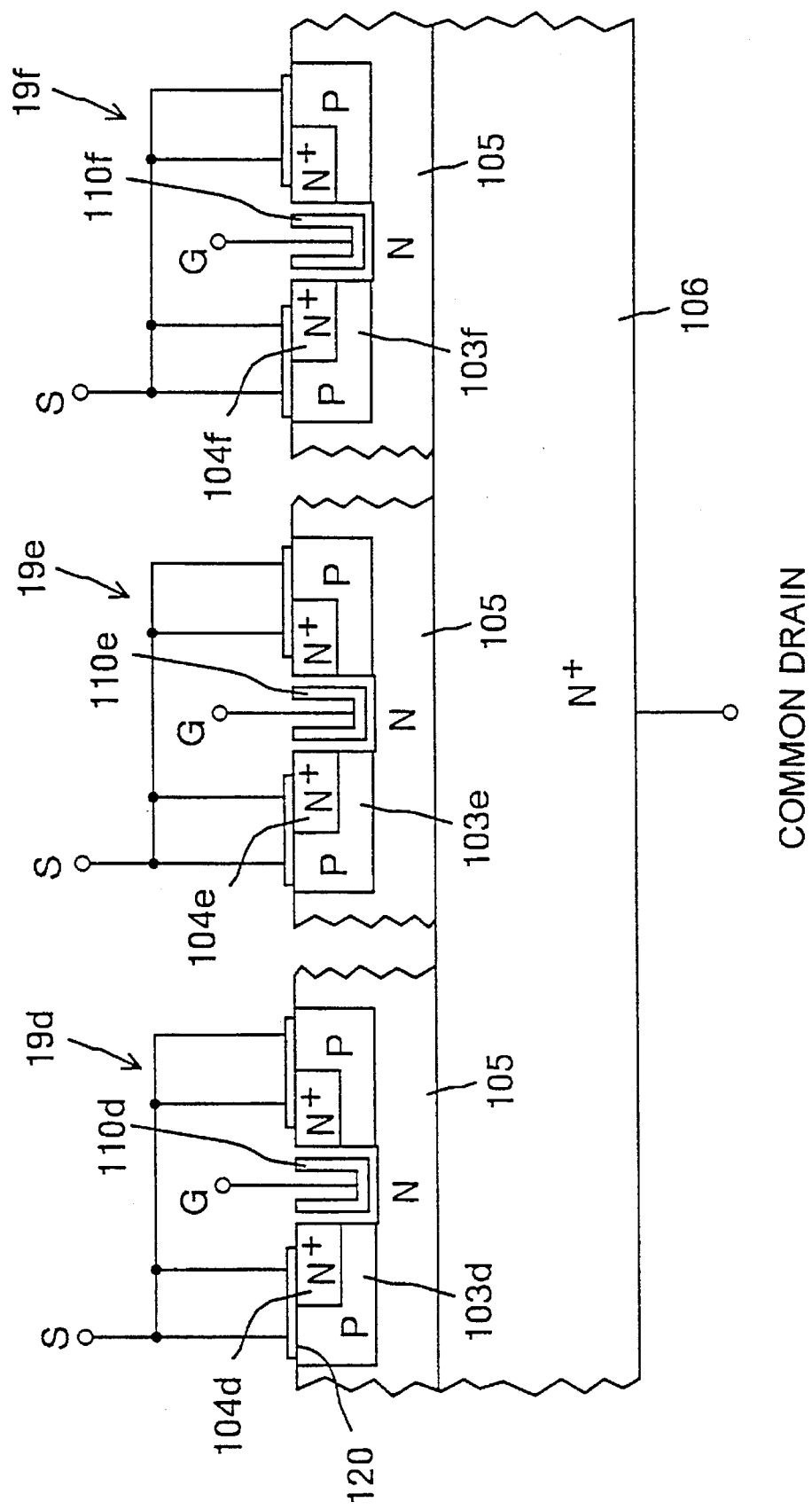
FIG. 17 is an exemplary section view of low-side MOS power transistors 19d through 19f in FIG. 15.

However, because the high-side MOS power transistors 19a through 19c may take a common source structure having the voltage withstanding layer on the source side and the low-side MOS power transistors 19d through 19f may take a common drain structure having the voltage withstanding layer on the drain side according to the present embodiment, the MOS power transistors 19a through 19f at the common source may be formed using one chip as shown in FIG. 16 and the low-side MOS power transistors 19d through 19f at the common drain may be formed by one chip as shown in FIG. 17.

Explaining in more detail with reference to FIG. 16, the $N^+$-type substrate 106 constitutes the common source electrode S of each of the high-side MOS power transistors 19a through 19c, the P-type well regions 103a through 103c in each phase are individually formed on the substrate 106 by being fully separated from each other by a distance which does not allow punch through between them. $N^+$ drain regions 104a through 104c are individually formed on the surface of each of the P-type well regions 103a through 103c. Gate electrodes 110a through 110c are disposed on the surface of each of the P-type well regions 103a through 103c via the insulating film 109 and each of the drain regions 104a through 104c are individually conducted to the N-type voltage withstanding layer 105 by the gate electrodes 110a through 110c.

Thereby an excellent effect that a half bridge composed of the three high-side MOS power transistors 19a through 19c may be integrated on one chip without increasing any process is brought about. Furthermore, because a power loss of each of the high-side MOS power transistors 19a through 19c is small, each element may be avoided from becoming high in temperature by integrating as described above.

Further, in FIG. 17, the $N^+$-type substrate 106 constitutes the common drain electrode D of each of the low-side MOS power transistors 19d through 19f, the P-type well regions 103 through 103c in each phase are individually formed on the substrate 106 by being fully separated from each other by a distance which does not allow punch through between them. $N^+$ source regions 104d through 104f are individually formed on the surface of each of the P-type well regions 103d through 103f. Gate electrodes 110d through 110f are disposed on the surface of each of the P-type well regions 103d through 103f via the insulating film 109 and each of the drain regions 104d through 104f are individually conducted to the N-type voltage withstanding layer 105 by the gate electrodes 110d through 110f.

Thereby an excellent effect that a half bridge composed of the three low-side MOS power transistors 19d through 19f may be integrated on one chip without increasing any process is brought about. Furthermore, because a power loss of each of the low-side MOS power transistors 19d through 19f is small, each element may be avoided from becoming high in temperature by integrating as described above.

[Fifth Embodiment]

Figure 18:
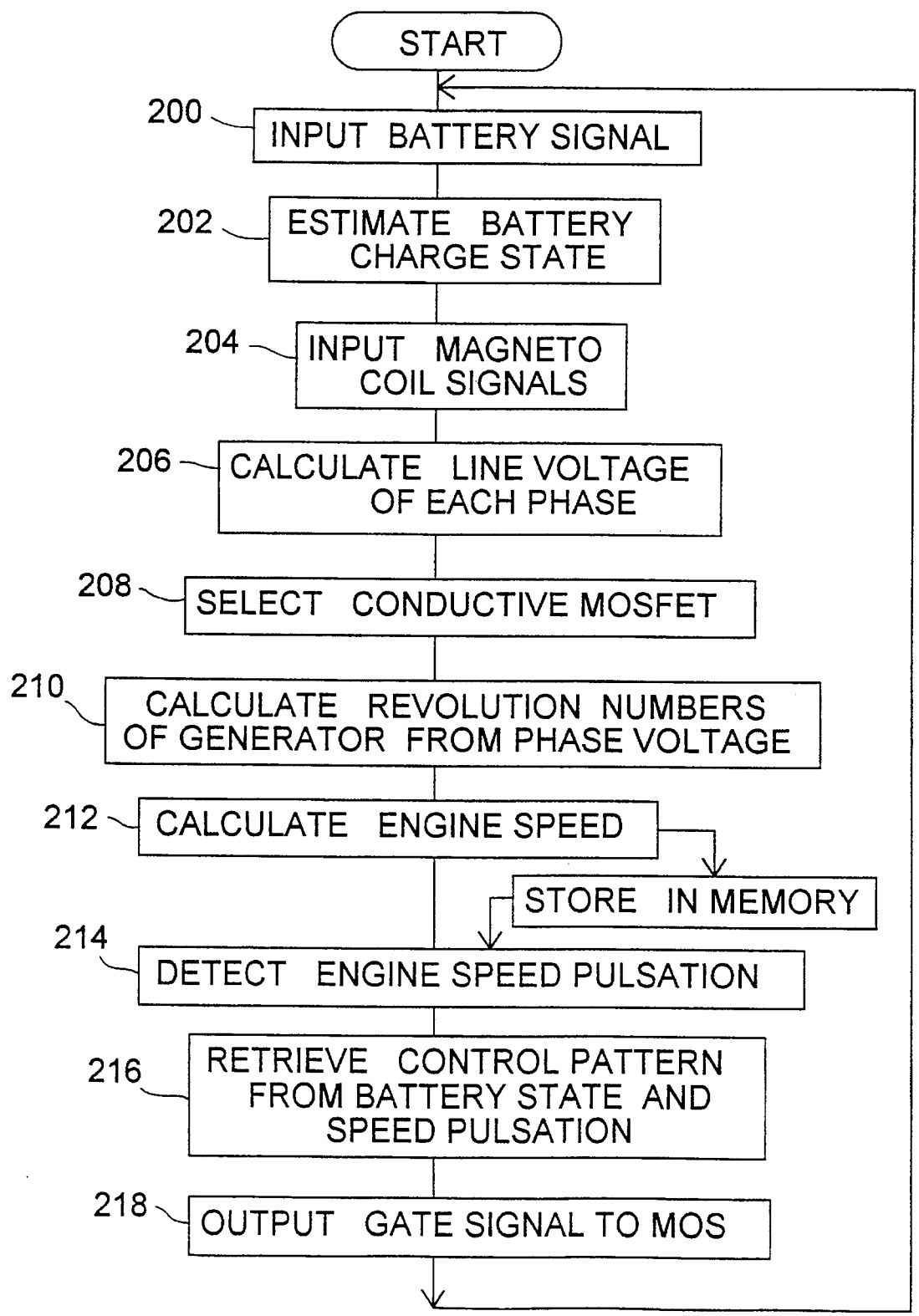
FIG. 18 is a flowchart showing a fifth embodiment and a control example of the AC generator for motor vehicles in FIG. 1.

A fifth embodiment will be explained with reference to FIG. 18. This embodiment proposes a control method of the three-phase full-wave rectifier 19. The control is executed by a controller (not shown) functionally integrated in a computer for controlling a car engine. The control operation may be naturally executed by the voltage regulating section 20.

The control operation will now be explained.

At first, a battery voltage is input (Step 200) and based on that, a battery charge state is estimated (Step 202).

Next, the input generated voltage signals Vu, Vv and Vw are input from the output terminal of each phase (Step 204) and based on them, the line voltage in each phase is calculated (Step 206). A phase whose line voltage exceeds the battery voltage and which is in a direction of charging the battery is detected and high-side and low-side MOS power transistors are selected (Step 208).

Then, a number of revolutions of the generator is calculated from the phase voltage (Step 210) and based on that, an engine speed is detected and is stored in a memory (Step 212).

Next, an engine rotary pulsation such as a rotary secondary higher harmonic component (in case of a 4-cylindered engine) or rotary tertiary higher harmonic component (in case of a 6-cylindered engine) caused by a non-uniformity of torque due to an irregular combustion of the engine during idling is detected (Step 214).

Next, a predetermined control pattern is retrieved from the calculated battery charge state and the engine rotary pulsation (Step 216), control amounts such as a conductive time and opening/closing timing of the MOS power transistors 19a through 19f are determined and the opening/closing of the MOS power transistors 19a through 19f is controlled based on the determined control amounts (Step 218).

By doing so, it becomes possible to control the power generation stressing on the charge when a remaining capacity of the battery is small for example and to change a generated amount to control torque so as to control the engine rotary pulsation when the engine rotary pulsation is large.

Although the control for suppressing such rotary pulsation has been theoretically considered in the past, it has not been put into practical use yet because it has not been appropriate to suppress the rotary pulsation at high speeds since mechanical vibration is propagated to the field coil and a time constant of the field circuit is large in case of a field winding type generator. Further, in case of a permanent magnet rotor, means for controlling and suppressing an output current at low loss level has not been discovered yet. The present embodiment allows realization of the reduction of the rotary vibration of the engine while suppressing increases in power loss.

In each of the aforementioned embodiments, either the high-side MOS power transistors 19a through 19c or the low-side MOS power transistors 19d through 19f may be replaced with a PN junction diode. Further, the SiC-MOSFET and the Si-MOSFET may be used in a mixed manner.

[Sixth Embodiment]

Figure 19:
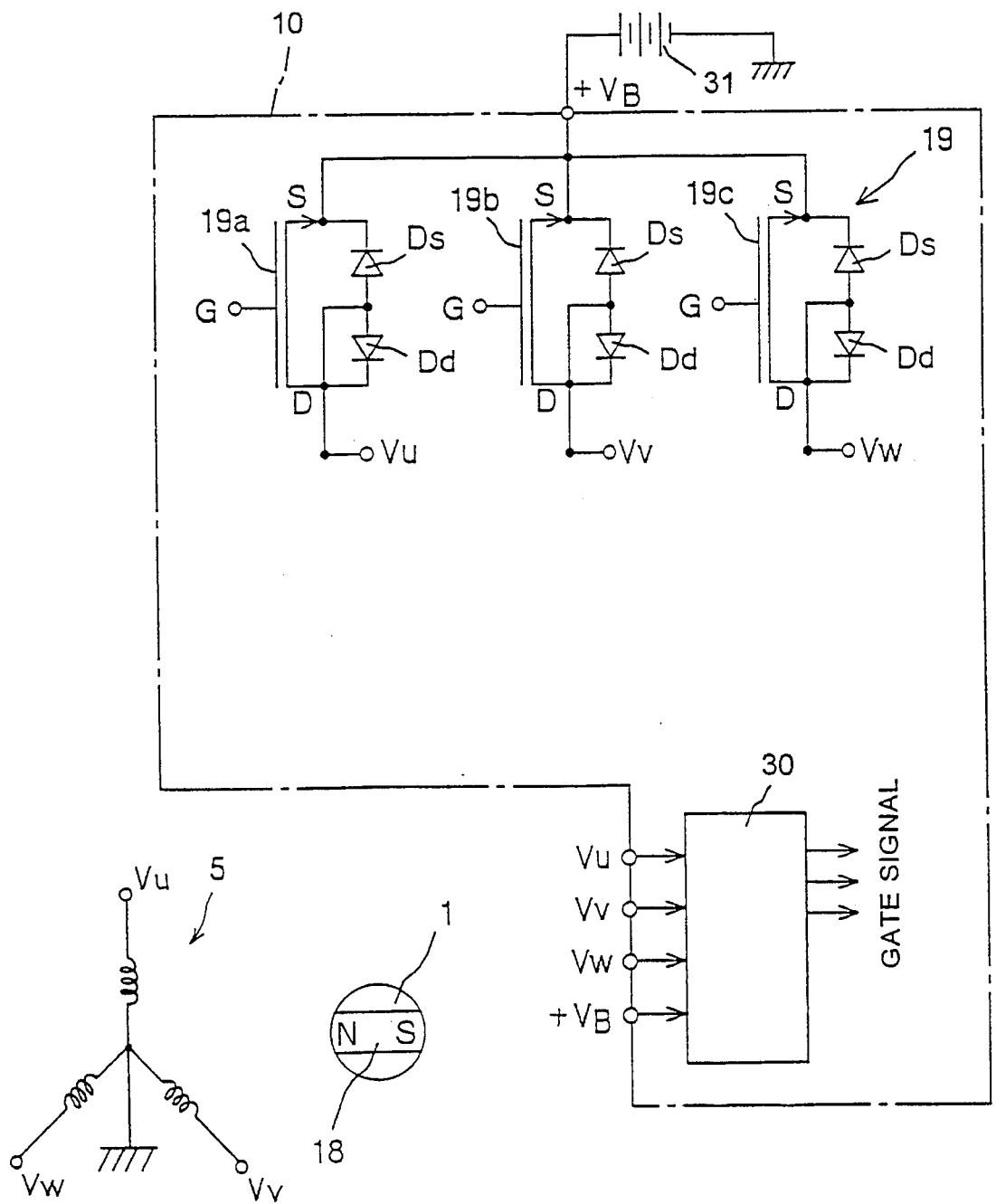
FIG. 19 is a circuit diagram showing a sixth embodiment.

A sixth embodiment of the present invention will be explained with reference to FIG. 19.

In this embodiment, a half-wave rectifier is constructed and the SiC MOS power transistors 19a through 19c are interposed between the output end of the three-phase armature winding 5 of each phase and the high potential end of a battery 31. A neutral point of the three-phase winding is connected to the low potential end of the battery 31.

The voltage regulating section 30 reads voltages Vu, Vv and Vw of the three-phase armature winding in each phase to the low potential of the battery and selects a phase voltage which is greater than the terminal voltage of the battery 31 to turn on a MOS power transistor which corresponds to that phase.

Thereby, an output current, which is a three-phase AC current that is half-wave rectified, may be obtained for the battery 31. By doing so, although the output is somewhat reduced as compared to the first embodiment, the number of the MOSFETs to be controlled is reduced to half, so that the controlling apparatus may be simplified and downsized, which has been the among the objects of the present invention.

Of course, it is possible to adopt a structure in which the MOS power transistors are connected to the low potential side of the battery and the neutral point are connected to the high potential side of the battery, and the neutral point may float. Further, they don't need to be three-phase.

By the way, the present invention may be applied not only to a field coil type rotor for which no exciting flux amount is controlled, but also to a rotor having a structure in which a field coil and magnet are used together and to a field coil type rotor for which an exciting flux amount is controlled which is explained below.

[Seventh Embodiment]

Figure 20:
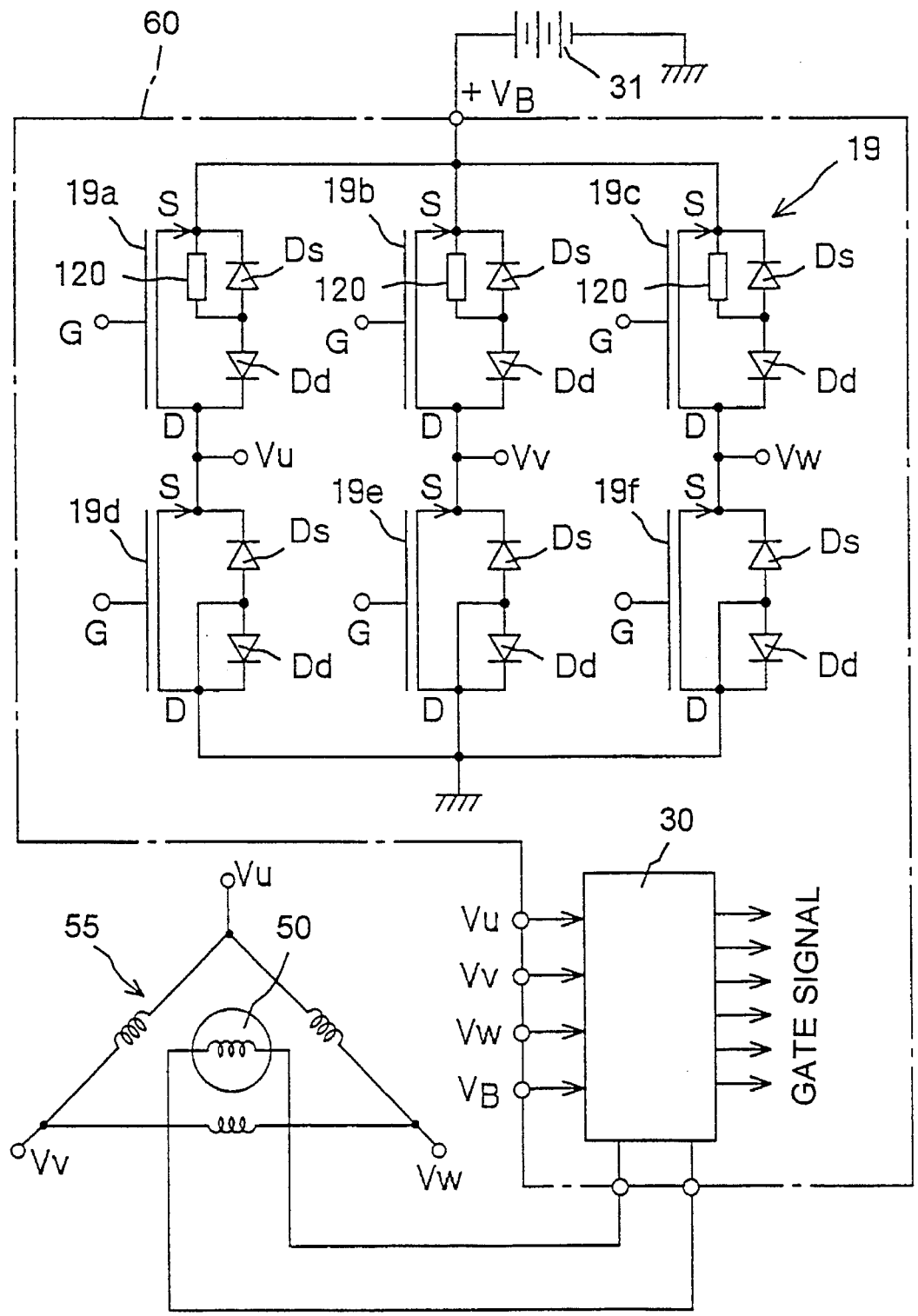
FIG. 20 is a circuit diagram of an AC generator for motor vehicles according to a seventh embodiment.
Figure 21:
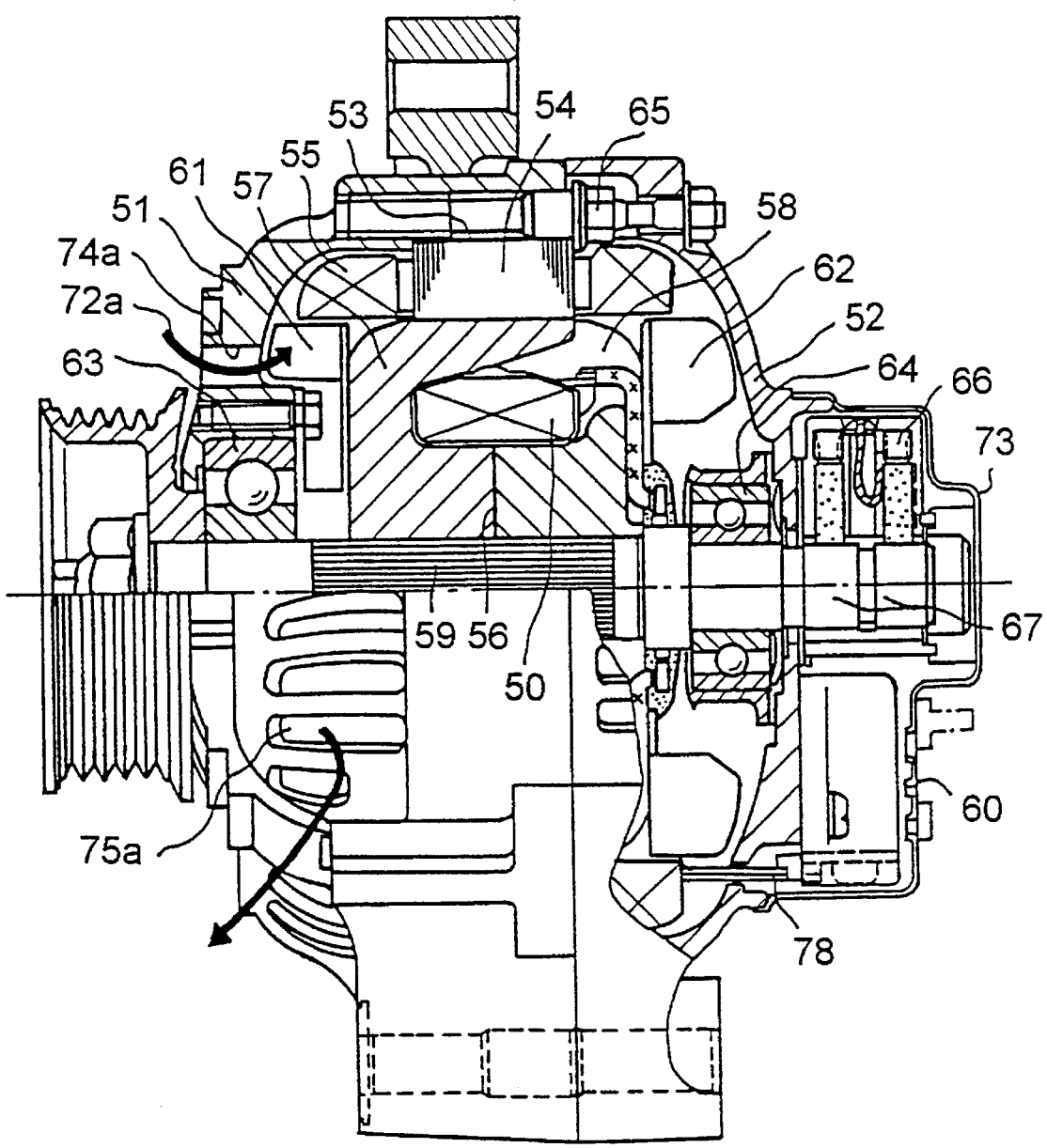
FIG. 21 is a sectional view of the AC generator for motor vehicles in FIG. 20.

A seventh embodiment of the present invention will be explained with reference to FIGS. 20 and 21. FIG. 21 shows its whole structure.

The housing of the generator is composed of a drive frame 51 and a rear frame 52 which are directly coupled by a plurality of stud bolts 65.

A stator core 53 is fixed at the inner periphery of the above-mentioned frames 51 and 52 and a three-phase armature winding 55 is wound around the stator core 53. Bearings 63 and 64 fixed by the frames 51 and 52 rotably support a shaft 59 to which a rotor core 56 is attached locating at the inner periphery of the stator core 53. A field coil 50 is wound around the rotor core 56 and cooling fans 61 and 62 are provided at both end faces of pole cores 57 and 58. A voltage regulator 60 built in the three-phase full-wave rectifier 19 is attached at the outside of the rear frame 52.

Next, a circuit structure of the AC generator for motor vehicles of the present embodiment will be explained with reference to FIG. 20.

The voltage regulator 60 comprises the three-phase full-wave rectifier 19 and the voltage regulating section 30. The three-phase full-wave rectifier 19 comprises N-channel enhancement type MOS power transistors 19a through 19f using monocrystal SiC as their base material. The high-side transistors 19a through 19c connect the output end of each phase of the three-phase armature winding 55 with the high potential end of the battery 31 and the low-side transistors 19d through 19f connect the output end of each phase of the three-phase armature winding 55 with the low potential end of the battery 31.

The voltage regulating section 30 is connected to the field coil 50 via a brush 66 and slip ring 67 and is mounted on the same substrate (not shown) with the three-phase full-wave rectifier 19. The wiring may be shortened by thus mounting the three-phase full-wave rectifier 19 and the voltage regulating section 30 on the same substrate. The voltage regulating section 30 inputs a generated voltage in each phase from the output end of each phase of the three-phase armature winding 55 and controls a gate voltage to be applied to each gate electrode of the MOS power transistors 19a through 19f.

Operations of the above-mentioned apparatus will be explained. When the rotor core 56 is rotated by an engine (not shown) and the voltage regulating section 30 in the voltage regulator 60 reads a voltage of the battery 31 and controls the field coil 50 by turning it ON and OFF so that the voltage becomes constant, a three-phase AC voltage is induced in the three-phase armature winding 55 and thereby a DC current full-wave rectified by the three-phase full-wave rectifier 19 charges the battery 31 or is consumed by electronic loads or the like of the car. The cooling fans 61 and 62 are rotated to cool down the field coil 50, three-phase armature winding 55 and voltage regulator 60.

Next, opening/closing control of each of the MOS power transistors 19a through 19f of the three-phase full-wave rectifier 19 by means of the voltage regulating section 30 will be explained.

The voltage regulating section 30 reads generated voltages Vu, Vv and Vw in respective phase which are potentials at the output ends of the three-phase armature winding 55 in respective phase, selects a line generated voltage which is greater than a terminal voltage of the battery 31 among their line generated voltages Vu–Vv, Vv–Vw and Vw–Vu and turns on one MOS power transistor among the high-side MOS power transistors 19a through 19c and one MOS power transistor among the low-side MOS power transistors 19d through 19f so that the selected line generated voltage is applied to the battery 31. Thereby, a charging current is fed from the selected three-phase armature winding to the battery 31.

By the way, a reverse current flows through a parasitic diode Dd of the MOS power transistor which is OFF among the high-side MOS power transistors 19a through 19c and the high resistance 120 which is connected thereto. For example, the above-mentioned reverse current flows when the generated voltage Vv in respective phase is lower than the battery voltage. However, because this reverse current is restricted by the high resistance 120 (preferably more than 150 Ω), it practically causes no trouble.

As usual, the voltage regulating section 30 detects the terminal voltage of the battery 31 similarly to a normal regulator, compares the detected voltage with a predetermined reference voltage and based on the comparison result, controls the connection/disconnection of the exciting current to maintain the terminal voltage of the battery 31 at a target level.

[Eighth Embodiment]

Figure 22:
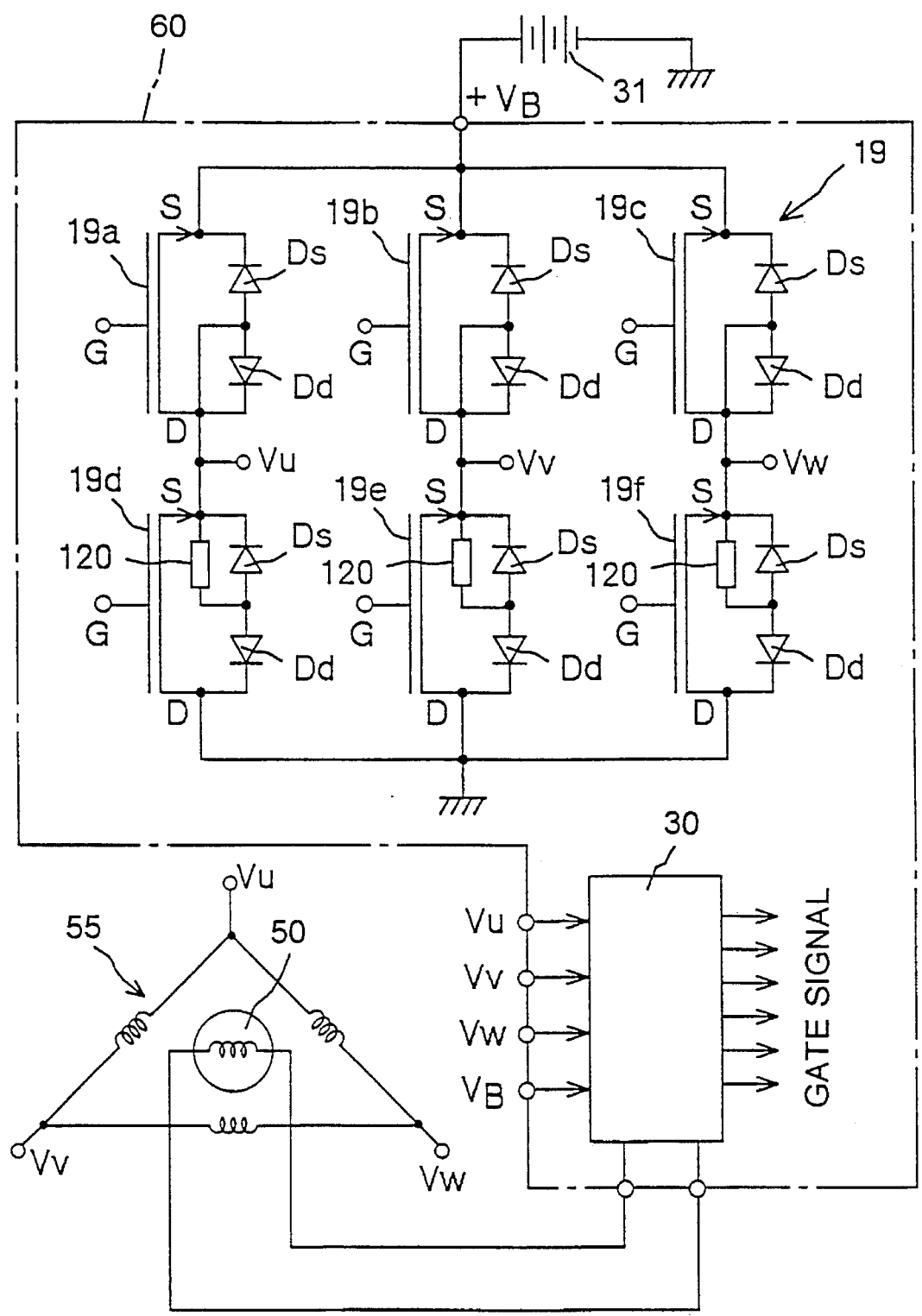
FIG. 22 is a circuit diagram showing an eighth embodiment.

An eighth embodiment of the present invention will be explained with reference to FIG. 22.

In this embodiment, the high resistance 120 is built in the low-side MOS power transistors 19*d* through 19*f* in contrast to the seventh embodiment. The same effect with that of the seventh embodiment is obtained.

[Ninth Embodiment]

Figure 23:
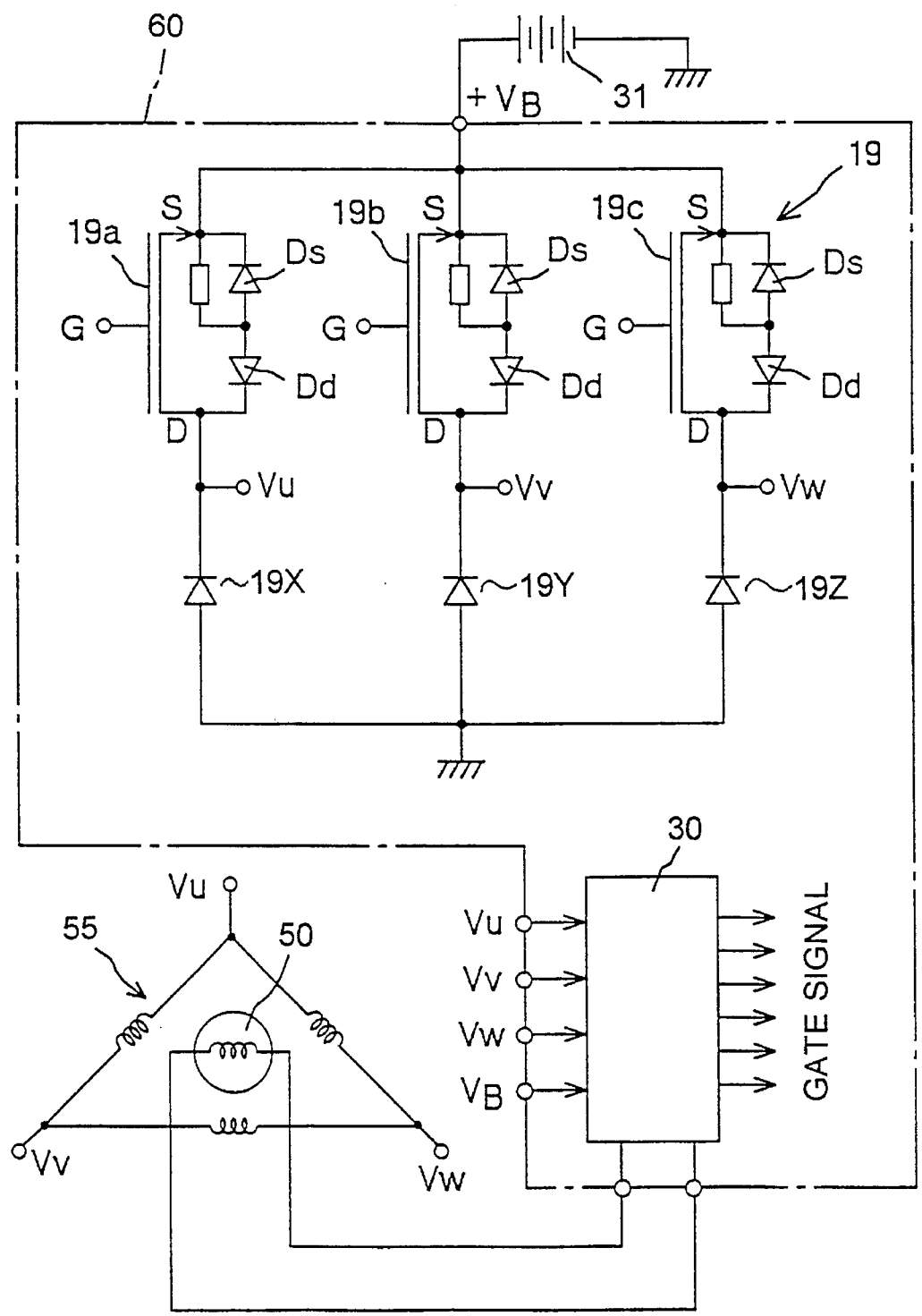
FIG. 23 is a circuit diagram showing a ninth embodiment.

A ninth embodiment will be explained with reference to FIG. 23.

In this embodiment, the low-side MOS power transistors 19*d* through 19*f* of the seventh embodiment are replaced with the PN junction diodes 19X, 19Y and 19Z. A similar effect with that of the seventh embodiment may be obtained, though it is not as great. Of course, the high-side MOS power transistors 19*a* through 19*c* may be replaced with the PN junction diodes in the eighth embodiment as well.

While the three-phase full-wave rectifier 19 of the AC generator for motor vehicles has been described in the above explanation, the three-phase full-wave rectifier 19 of the present embodiment may be adopted or used together of course as a switching inverter circuit for generating a three-phase AC voltage since it is capable of switching.

As another aspect of the embodiment, the high resistance 120 of the MOS power transistors 19*a* through 19*f* may be configured by a junction resistance of the P-type well region 103 and the N$^+$-type region 104. In this case, the P-type well region 103 is put into a floating state and a potential is given by a leakage current flowing through the above-mentioned junction resistance in a DC current manner.

At this time, although the potential of the P-type well region 103 is apt to fluctuate through a gate capacity due to a fluctuation of the gate potential, its operation is possible since a channel resistance is essentially affected the most by a difference between the gate potential and source potential if a fluctuation of a threshold voltage Vt is ignored by a substrate effect.

By the way, while the MOS power transistors 19*a* through 19*f* in each embodiment described above are designed to have 250 V of withstanding voltage using 6H-SiC as their base material, an analytical result of resistance values of the three-phase full-wave rectifier 19 for the AC generator for motor vehicles using the 6H-SiC MOS power transistors 19*a* through 19*f* and the three-phase full-wave rectifier 19 for the AC generator for motor vehicles using the Si MOS power transistors (see FIG. 12) will be theoretically explained below. However, the channel resistance increasing effect due to the feedback effect of the source parasitic resistance Rs is ignored here. Further, the vertical structure shown in FIG. 8 is adopted as its circuit structure and their chip area is assumed to be equal.

A resistance R of a transistor is a sum of a channel resistance rc and a resistance rb of the N-type voltage withstanding layer 105. When they are expressed as;

$$rc = L/W \cdot (1/\mu s \cdot \epsilon s \cdot \epsilon_0)^{-1} \cdot (Tox/(Vg - Vt))$$

$$rb = 4Vb^2 \cdot (1/\mu \cdot \epsilon s \cdot \epsilon_0 \cdot Ec \cdot A)$$

the resistance value of the SiC MOS power transistor was reduced to about 1/15 as compared to that of the Si MOS power transistor.

Where the yield field strength Ec is $3 \times 10^5$ V/cm in Si and $3 \times 10^6$ V/cm in SiC, the dielectric constant $\epsilon s$ is 11.8 in Si and 10.0 in SiC, the area A is 1 mm$^2$ in both and Vb is a breakdown voltage (withstanding voltage). Further, $\mu$ is a bulk mobility of electrons and is 1,100 cm$^2$/(V·S) in Si and 370 cm$^2$/(V·S) in SiC, the channel length L is 1 μm in both, the channel width W is 222 μm in both and μs is a channel mobility of the electrons and is 500 cm$^2$/(V·S) in Si and 100 cm$^2$/(V·S) in SiC.

It was found from the above expressions that the resistance value of the SiC becomes smaller above 50 V of withstanding voltage (see range C in FIG. 12). By the way, because the substrate is used as the drain in the above calculation, the resistance of Si should increase much more by the increase of channel resistance due to the feedback effect of the source parasitic resistance Rs described above when the substrate is used as the source. In FIG. 12, range A shows a desired range of withstand voltage as current element for an alternator, and range B shows a range wherein Si element is effective as the current element (<50 volts).

Accordingly, it can be assumed that the resistance of the SiC MOS power transistor will become lower when the withstanding voltage is more than 100 V even if the design rule is changed somewhat.

By the way, although the P-type well regions 103*a* through 103*f* have been formed by ion-implantation, they may be formed by epitaxial growth.

While preferred embodiments have been described, variations thereto will occur to those skilled in the art within the scope of the present inventive concept which are delineated by the following claims.

What is claimed is:

1. A power converter for an AC generator for motor vehicles for converting a generated voltage of the AC generator driven by an engine into a DC voltage to feed to a battery, comprising at least one of:

1) a first group of high-side MOS power transistors for connecting an output end of an armature coil which generates said generated voltage with a high potential end of said battery; and 2) a second group of low-side MOS power transistors for connecting said output end with a low potential end of said battery, wherein:

said high-side and/or said low-side MOS power transistors each have a source region, a well region, and a drain region; and each transistor in at least one of said first group and said second group of MOS power transistors has a high resistance connected in parallel with either a parasitic diode generated between said source region and well region or a parasitic diode generated between said drain region and well region for preventing conductance of current through said parasitic diode.

2. The power converter according to claim 1, wherein said high resistance is connected in parallel with said parasitic diode between said drain region and well region.

3. The power converter according to claim 1, wherein said high resistance is connected in parallel with said parasitic diode between said source region and well region.

4. The power converter according to claim 1, wherein said AC generator has a three-phase armature coil and said high-side and/or said low-side MOS power transistors are connected to each end of said three-phase armature coil.

5. The power converter according to claim 1 or 4, wherein both said high-side MOS power transistors and said low-side MOS power transistors are connected between said armature coil and said battery, and one of said first group and said second group of said MOS power transistors have high resistances connected in parallel with the parasitic diode between said drain region and well region and another of said first group and said second group of said MOS power transistors have high resistances connected in parallel with the parasitic diode between said source region and well region.

6. The power converter according to claim 1 or 4, wherein each of said high-side MOS power transistors is connected in series with one of said low-side MOS power transistors, respectively, and wherein one transistor of each connected pair of said high-side and said low-side MOS power transistors has said high resistance and said parasitic diode created in another transistor of each connected pair of said high side and said low-side MOS power transistors blocks current from flowing through said high resistance.

7. The power converter according to claim 1 or 4, wherein said high-side and/or said low side MOS power transistors are formed using monocrystal SiC.

8. The power converter according to claim 1 or 4, wherein said high resistance is made of an alloy layer of a metallic electrode disposed on the surface of said well region and monocrystal SiC forming said well region.

9. The power converter according to claim 1 or 4, wherein said power converter includes only one of said first group and said second group of said MOS power transistors and PN junction diodes are provided as a substitute for another of said first group and said second group of said MOS power transistors.

10. The power converter according to claim 3, wherein each of said MOS power transistors comprises an $N^+$-type substrate forming a drain electrode, an N-type voltage withstanding layer formed on said substrate, a P-type well region formed on the surface of said voltage withstanding layer, an $N^+$-type source region formed on the surface of said P-type well region and being a source electrode and a gate electrode disposed on the surface of said P-type well region through an insulating film and for forming an N-type channel for conducting said source region and said voltage withstanding layer.

11. The power converter according to claim 10, wherein:

said generator has a three-phase armature coil and said low-side MOS power transistors connect each end of said three-phase armature coil and said low potential end of said battery, said substrate forms a common drain electrode of each of said low-side MOS power transistors, each said P-type well region is individually formed on said N-type voltage withstanding layer, each said $N^+$ source region is individually formed on the surface of one said P-type well region, respectively and each said gate electrode is disposed on said insulating film, corresponding to one said P-type well region formed on said N-type voltage withstanding layer, respectively, each said gate electrode individually controlling conduction of a corresponding said source region and said N-type voltage withstanding layer through a corresponding said P-type well region, respectively.

12. The power converter according to one of claims 1 through 4, wherein said high-side and/or said low-side MOS power transistors are formed using monocrystal SiC and designed so that more than 100 V can be applied between a source electrode and a drain electrode and between a drain electrode and a gate electrode of said high-side and/or said low-side MOS power transistors.

13. The power converter according to one of claims 1 through 4, wherein said power converter is one of a full-wave rectifier and a half-wave rectifier.

14. The power converter according to claim 1, wherein said generator has a permanent magneto rotor.

15. The power converter according to claim 14, wherein said high-side MOS power transistors and low-side MOS power transistors form a three-phase full-wave rectifier and said full-wave rectifier and a regulator for rectified voltage are stored within a common metallic case and are attached to a housing of said generator.

16. The power converter according to claim 15, wherein said metallic case is formed in an arc shape and is closely attached to said housing of said generator so that heat is transmitted.

17. The power converter according to one of claims 1 through 4, wherein said high resistance is selected such that a resistance value thereof is 150 Ω or more.

18. The power converter according to one of claims 1 through 4, wherein said high resistance is disposed between said well region and an electrode formed on said well region via said high resistance.

* * * * *